United States Patent
Shibazaki et al.

(10) Patent No.: US 8,488,106 B2
(45) Date of Patent: Jul. 16, 2013

(54) MOVABLE BODY DRIVE METHOD, MOVABLE BODY APPARATUS, EXPOSURE METHOD, EXPOSURE APPARATUS, AND DEVICE MANUFACTURING METHOD

(75) Inventors: Yuichi Shibazaki, Kumagaya (JP); Akira Okutomi, Saitama (JP); Kazuhiro Hirano, Ageo (JP)

(73) Assignee: Nikon Corporation, Tokyo (JP)

(*) Notice: Subject to any disclaimer, the term of this patent is extended or adjusted under 35 U.S.C. 154(b) by 358 days.

(21) Appl. No.: 12/976,347

(22) Filed: Dec. 22, 2010

(65) Prior Publication Data
US 2011/0177461 A1 Jul. 21, 2011

Related U.S. Application Data

(60) Provisional application No. 61/302,633, filed on Feb. 9, 2010, provisional application No. 61/290,359, filed on Dec. 28, 2009.

(30) Foreign Application Priority Data

Dec. 28, 2009 (JP) .................................. 2009-297905

(51) Int. Cl.
| | |
|---|---|
| *G01B 11/00* | (2006.01) |
| *G03B 27/32* | (2006.01) |
| *G03B 27/42* | (2006.01) |
| *G03B 27/58* | (2006.01) |
| *G03B 27/62* | (2006.01) |
| *H02K 41/02* | (2006.01) |

(52) U.S. Cl.
USPC .............. 355/72; 310/12.06; 355/53; 355/75; 355/77; 356/12.06

(58) Field of Classification Search
CPC .......................... G03F 7/70725; G03F 9/7092
USPC ................. 310/12.05–12.06; 355/53, 72, 75, 355/77; 356/399–401, 614–624
See application file for complete search history.

(56) References Cited

U.S. PATENT DOCUMENTS

| | | | |
|---|---|---|---|
| 5,448,332 A | 9/1995 | Sakakibara et al. | |
| 5,610,715 A | 3/1997 | Yoshii et al. | |

(Continued)

FOREIGN PATENT DOCUMENTS

| | | |
|---|---|---|
| EP | 1 420 298 A2 | 5/2004 |
| JP | A-04-265805 | 9/1992 |

(Continued)

OTHER PUBLICATIONS

International Search Report mailed May 30, 2011 issued in International Patent Application No. PCT/JP2010/073871.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

A stage is driven (position control) using a hybrid signal which is obtained by synthesizing an output signal of an interferometer (an interferometer system) and an output signal of an encoder (an encoder system) that are made to pass through a high pass filter and a low pass filter, respectively. A cutoff frequency is set to a frequency corresponding to a speed slightly smaller than the speed of the stage at the time of scanning exposure. This allows the stage to be driven using an interferometer whose linear measurement is high at the time of scanning exposure, and using an encoder whose measurement reproducibility is high at the time of stepping.

64 Claims, 13 Drawing Sheets

U.S. PATENT DOCUMENTS

| | | | |
|---|---|---|---|
| 5,646,413 | A | 7/1997 | Nishi |
| 5,969,441 | A | 10/1999 | Loopstra et al. |
| 6,208,407 | B1 | 3/2001 | Loopstra |
| 6,590,634 | B1 | 7/2003 | Nishi et al. |
| 6,611,316 | B2 | 8/2003 | Sewell |
| 6,778,257 | B2 | 8/2004 | Bleeker et al. |
| 6,819,425 | B2 | 11/2004 | Kwan |
| 7,023,610 | B2 | 4/2006 | Ohtsuki et al. |
| 7,025,498 | B2 | 4/2006 | Del Puerto |
| 7,102,729 | B2 | 9/2006 | Renkens et al. |
| 7,161,659 | B2 | 1/2007 | Van Den Brink et al. |
| 7,238,931 | B2 | 7/2007 | Nabeshima et al. |
| 7,253,875 | B1 | 8/2007 | Luttikhuis et al. |
| 7,256,871 | B2 | 8/2007 | Loopstra et al. |
| 7,289,212 | B2 | 10/2007 | Kwan |
| 7,292,312 | B2 | 11/2007 | Loopstra et al. |
| 7,333,174 | B2 | 2/2008 | Koenen et al. |
| 7,348,574 | B2 | 3/2008 | Pril et al. |
| 7,349,069 | B2 | 3/2008 | Beems et al. |
| 7,362,446 | B2 | 4/2008 | Van Der Pasch et al. |
| 7,405,811 | B2 | 7/2008 | Beems et al. |
| 7,561,280 | B2 | 7/2009 | Schluchter et al. |
| 2002/0041377 | A1 | 4/2002 | Hagiwara et al. |
| 2003/0025890 | A1 | 2/2003 | Nishinaga |
| 2003/0128348 | A1 | 7/2003 | Nishi |
| 2005/0128461 | A1 | 6/2005 | Beems et al. |
| 2005/0174554 | A1 | 8/2005 | Sugawara et al. |
| 2006/0139660 | A1 | 6/2006 | Kwan |
| 2006/0227309 | A1 | 10/2006 | Loopstra et al. |
| 2007/0052976 | A1 | 3/2007 | Pril et al. |
| 2007/0076218 | A1 | 4/2007 | Van Empel et al. |
| 2007/0195296 | A1 | 8/2007 | Van Der Pasch et al. |
| 2007/0223007 | A1 | 9/2007 | Klaver et al. |
| 2007/0260419 | A1 | 11/2007 | Hagiwara |
| 2007/0263191 | A1 | 11/2007 | Shibazaki |
| 2007/0263197 | A1 | 11/2007 | Luttikhuis et al. |
| 2007/0288121 | A1 | 12/2007 | Shibazaki |
| 2008/0043212 | A1 | 2/2008 | Shibazaki |
| 2008/0074681 | A1 | 3/2008 | Loopstra et al. |
| 2008/0088843 | A1 | 4/2008 | Shibazaki |
| 2008/0094592 | A1 | 4/2008 | Shibazaki |
| 2008/0094593 | A1 | 4/2008 | Shibazaki |
| 2008/0094594 | A1 | 4/2008 | Shibazaki |
| 2008/0094604 | A1 | 4/2008 | Shibazaki |
| 2008/0105026 | A1 | 5/2008 | Loopstra et al. |
| 2008/0106722 | A1 | 5/2008 | Shibazaki |
| 2008/0165345 | A1 | 7/2008 | Hill |
| 2008/0218713 | A1 | 9/2008 | Shibazaki |
| 2008/0246936 | A1 | 10/2008 | Loopstra et al. |
| 2009/0004580 | A1 | 1/2009 | Kanaya |
| 2009/0027640 | A1 | 1/2009 | Shibazaki et al. |
| 2009/0033900 | A1 | 2/2009 | Kanaya |
| 2009/0040488 | A1 | 2/2009 | Shibazaki |
| 2009/0051892 | A1 | 2/2009 | Shibazaki et al. |
| 2009/0051893 | A1 | 2/2009 | Shibazaki et al. |
| 2009/0051894 | A1 | 2/2009 | Shibazaki et al. |
| 2009/0051895 | A1 | 2/2009 | Shibazaki |
| 2009/0053629 | A1 | 2/2009 | Shibazaki et al. |
| 2009/0059194 | A1 | 3/2009 | Kanaya |
| 2009/0059198 | A1 | 3/2009 | Shibazaki et al. |
| 2009/0073405 | A1 | 3/2009 | Kanaya |
| 2009/0115982 | A1 | 5/2009 | Kanaya |
| 2009/0122285 | A1 | 5/2009 | Kanaya |
| 2009/0122286 | A1 | 5/2009 | Kanaya |
| 2009/0122287 | A1 | 5/2009 | Kanaya |
| 2009/0153822 | A1 | 6/2009 | Shibazaki |
| 2009/0161086 | A1 | 6/2009 | Shibazaki |
| 2009/0180092 | A1 | 7/2009 | Butler et al. |
| 2009/0190110 | A1 | 7/2009 | Shibazaki |
| 2009/0225288 | A1 | 9/2009 | Shibazaki |
| 2009/0273767 | A1 * | 11/2009 | Makinouchi .................... 355/53 |
| 2009/0284716 | A1 | 11/2009 | Kanaya |
| 2009/0284717 | A1 | 11/2009 | Kanaya |
| 2009/0284723 | A1 | 11/2009 | Shibazaki |
| 2009/0284724 | A1 | 11/2009 | Kanaya |
| 2010/0073652 | A1 | 3/2010 | Shibazaki |
| 2010/0073653 | A1 | 3/2010 | Shibazaki |
| 2010/0081095 | A1 | 4/2010 | Shibazaki |
| 2010/0157274 | A1 | 6/2010 | Shibazaki |
| 2010/0157275 | A1 | 6/2010 | Shibazaki |
| 2010/0157276 | A1 | 6/2010 | Shibazaki |
| 2010/0159403 | A1 | 6/2010 | Shibazaki |
| 2010/0296070 | A1 | 11/2010 | Shibazaki |
| 2010/0296071 | A1 | 11/2010 | Shibazaki |
| 2010/0297562 | A1 | 11/2010 | Shibazaki |
| 2011/0051108 | A1 * | 3/2011 | Shibazaki ....................... 355/53 |

FOREIGN PATENT DOCUMENTS

| | | |
|---|---|---|
| WO | WO 99/49504 A1 | 9/1999 |
| WO | WO 2004/055803 A1 | 7/2004 |

OTHER PUBLICATIONS

Written Opinion of the International Searching Authority mailed May 30, 2011 issued in International Patent Application No. PCT/JP2010/073871.

* cited by examiner

Fig. 10
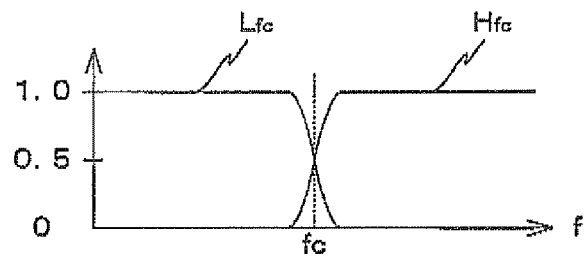
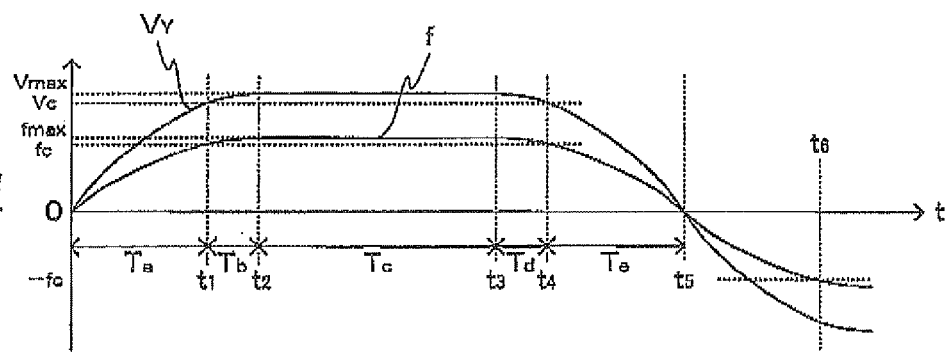
Fig. 11A
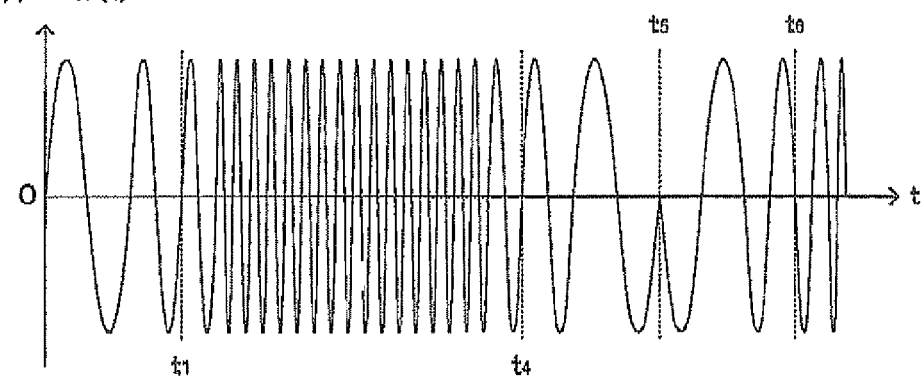
Fig. 11B
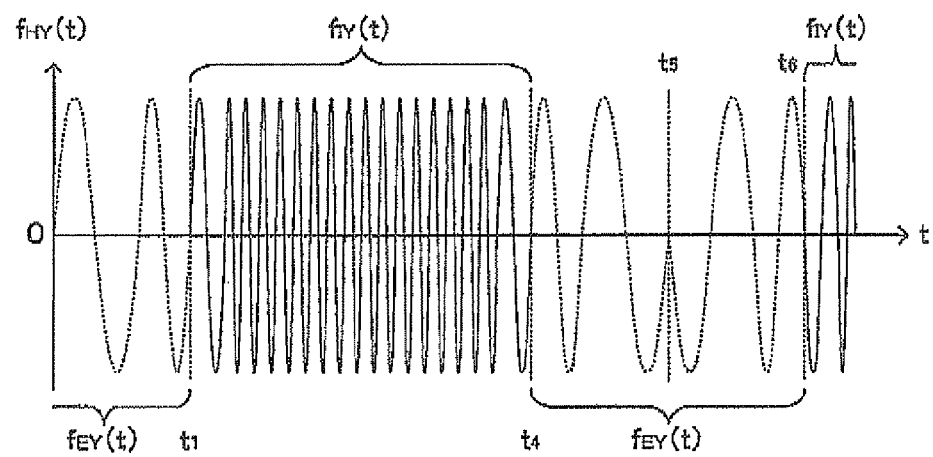
Fig. 11C

MOVABLE BODY DRIVE METHOD, MOVABLE BODY APPARATUS, EXPOSURE METHOD, EXPOSURE APPARATUS, AND DEVICE MANUFACTURING METHOD

CROSS-REFERENCE TO RELATED APPLICATIONS

This non-provisional application claims the benefit of Provisional Application No. 61/290,359 filed Dec. 28, 2009, and Provisional Application No. 61/302,633 filed Feb. 9, 2010, the disclosures of which are hereby incorporated herein by reference in their entirety.

BACKGROUND OF THE INVENTION

1. Field of the Invention

The present invention relates to movable body drive methods, movable body apparatus, exposure methods, exposure apparatus, and device manufacturing methods, and more particularly to a movable body drive method in which a movable body is driven along a predetermined plane, a movable body apparatus including the movable body, an exposure method which uses the movable body drive method, an exposure apparatus which is equipped with the movable body apparatus, and a device manufacturing method which uses the exposure method or the exposure apparatus.

2. Description of the Background Art

Conventionally, in a lithography process for manufacturing microdevices (such as electron devices) such as semiconductor devices, liquid crystal display devices and the like, exposure apparatuses such as a projection exposure apparatus by a step-and-repeat method (a so-called stepper) and a projection exposure apparatus by a step-and-scan method (a so-called scanning stepper (which is also called a scanner) are mainly used.

In this kind of exposure apparatus, in order to transfer a pattern of a reticle (or a mask) on a plurality of shot areas on a wafer, a wafer stage holding the wafer is driven, for example, by linear motors and the like. In this case, position measurement of the wafer stage has been generally performed, using a laser interferometer which is stable and has high resolution.

However, requirements for a stage position control with higher precision are increasing due to finer patterns that accompany higher integration of semiconductor devices, and now, measurement errors resulting from air fluctuation generated by temperature variation of the atmosphere on the beam path of the laser interferometer or by temperature gradient has come to occupy a large percentage in the overlay budget.

As a position measuring device of the stage instead of the laser interferometer, an encoder (for example, U.S. Pat. No. 7,238,931) is promising. However, while the encoder is superior to the laser interferometer in the viewpoint of measurement reproducibility because of using a scale, it is inferior to the laser interferometer for the mechanical instability (drift of the grating pitch, fixed location drift, thermal expansion and the like) of the scale in the viewpoint of linearity.

In view of the drawbacks of the laser interferometer and the encoder described above, various proposals are being made (refer to, for example, U.S. Patent Application Publication No. 2007/0288121, or U.S. Patent Application Publication No. 2009/0027640 and the like) of methods used to measure the position of a stage using both a laser interferometer and an encoder (a position detection sensor which uses a diffraction grating). However, the methods and the like disclosed in these U.S. Patent Application Publication and the like are still not sufficient enough when ensuring a highly accurate and stable position control performance of the stage which is required in the current exposure apparatus.

SUMMARY OF THE INVENTION

According to a first aspect of the present invention, there is provided a movable body drive method in which a movable body is driven along a predetermined plane, the method comprising: driving the movable body based on one of a synthesized signal of a first signal which is a first detection signal that has been made to pass through a high pass filter and a second signal which is a second detection signal that has been made to pass through a low pass filter having a cut off frequency which is the same as the high pass filter, the first detection signal corresponding to a position of the movable body obtained by receiving a return beam of a measurement beam via an optical member provided on the movable body, and the second detection signal being obtained by irradiating a measurement beam on a diffraction grating provided on a measurement plane parallel to the predetermined plane on one of the movable body and an outside of the movable body and receiving a diffraction beam from the diffraction grating by a measurement system which has at least a part of the system placed on the other of the movable body and an outside of the movable body, and a signal which is substantially equivalent to the synthesized signal.

When the optical member provided on the movable body is a reflection surface member, the return beam of the measurement beam via the optical member can be a reflection beam of a measurement beam that has been irradiated on the reflection surface, or in the case the optical member is a deflection member or a separation member, the return beam can be a return beam of a reflection beam of a measurement beam that has been irradiated on another reflection surface member different from the optical member via the optical member. In this specification, the expression, a return beam of a measurement beam via an optical member, is used in such a meaning.

According to this method, the movable body is driven based on a synthetic signal (or a signal substantially equivalent to the synthetic signal) of a first signal which is the first detection signal that has been made to pass through the high pass filter and a second signal which is the second detection signal that has been made to pass through the low pass filter (which has the same cutoff frequency as the high pass filter). Therefore, in the case the frequency of the first and second detection signals is higher than a predetermined cutoff frequency, the movable body is driven based on the first detection signal of the first measurement system having high linear measurement, whereas in the case when the first and second detection signals is lower, the movable body is driven based on the second detection signal of the second measurement system having high measurement reproducibility.

According to a second aspect of the present invention, there is provided a first exposure method, comprising: making a movable body hold an object subject to exposure; and driving the movable body by using the movable body drive method of the present invention when irradiating an energy beam on the object held by the movable body and forming a pattern on the object.

According to this method, it becomes possible to linearly drive the movable body at a constant speed quickly and with high precision with respect to the energy beam, as well as drive wafer stage WST precisely to the starting position of the constant speed drive. The former makes it possible to form a pattern on the object with good precision, and the latter makes it possible to improve the overlay accuracy.

According to a third aspect of the present invention, there is provided a movable body apparatus, comprising: a movable body which moves along a predetermined plane; a first measurement system which outputs a first detection signal corresponding to a position of the movable body obtained by receiving a return beam of a measurement beam via an optical member provided on the movable body; a second measurement system which outputs a second detection signal by irradiating a measurement beam on a diffraction grating on a measurement plane parallel to the predetermined plane provided on one of the movable body and an outside of the movable body and receiving a diffraction beam from the diffraction grating, and has at least a part of the system placed on the other of the movable body and an outside of the movable body; and a drive system which drives the movable body based on a synthesized signal of a first signal which is the first detection signal that has passed through a high pass filter and a second signal which is the second detection signal that has passed through a low pass filter having the same cutoff frequency as the high pass filter, or a signal which is substantially equivalent to the synthesized signal.

According to this apparatus, the movable body is driven based on a synthetic signal (or a signal substantially equivalent to the synthetic signal) of a first signal which is the first detection signal that has been made to pass through the high pass filter and a second signal which is the second detection signal that has been made to pass through the low pass filter (which has the same cutoff frequency as the high pass filter). Therefore, in the case the frequency of the first and second detection signals is higher than a predetermined cutoff frequency, the movable body is driven based on the first detection signal of the first measurement system having high linear measurement, whereas in the case when the first and second detection signals is lower, the movable body is driven based on the second detection signal of the second measurement system having high measurement reproducibility.

According to a fourth aspect of the present invention, there is provided a first exposure apparatus, the apparatus comprising the movable body apparatus of the present invention in which an object is held by the movable body; and a pattern generation device which generates a pattern by irradiating an energy beam on the object held by the movable body and exposing the object.

According to this apparatus, it becomes possible to form a pattern on an object with good precision, and also to improve the overlay accuracy.

According to a fifth aspect of the present invention, there is provided a second exposure method in which an energy beam is irradiated on a mask on which a pattern is formed, and the pattern is transferred on an object, the method comprising: driving at least one of a first movable body which moves along a predetermined plane holding the object and a second movable body which holds the mask, based on one of a synthesized signal of a first signal which is a first detection signal that has been made to pass through a high pass filter and a second signal which is a second detection signal that has been made to pass through a low pass filter having a cut off frequency which is the same as the high pass filter, the first detection signal corresponding to a position of the movable body obtained by receiving a return beam of a measurement beam via an optical member provided on the first movable body, and the second detection signal being obtained by irradiating a measurement beam on a diffraction grating provided on a measurement plane parallel to the predetermined plane on one of the movable body and an outside of the movable body and receiving a diffraction beam from the diffraction grating by a measurement system which has at least a part of the system placed on the other of the movable body and an outside of the movable body, and a signal which is substantially equivalent to the synthesized signal.

According to this method, at least one of the first movable body and the second movable body is driven based on a synthetic signal (or a signal substantially equivalent to the synthetic signal) of a first signal which is the first detection signal that has been made to pass through the high pass filter and a second signal which is the second detection signal that has been made to pass through the low pass filter (which has the same cutoff frequency as the high pass filter). Therefore, in the case the frequency of the first and second detection signals is higher than a predetermined cutoff frequency, at least one of the first movable body and the second movable body is driven based on the first detection signal of the first measurement system having high linear measurement, whereas in the case when the first and second detection signals is lower, the movable body is driven based on the second detection signal of the second measurement system having high measurement reproducibility. This makes it possible to transfer and form a pattern with an accurate overlay in a predetermined area (pattern formation area) on an object.

According to a sixth aspect of the present invention, there is provided a third exposure method in which a mask and an object is synchronously moved in a predetermined direction while an energy beam is irradiated on the mask on which a pattern is formed, and the pattern is transferred onto the object, the method comprising: driving at least one of a first movable body moving along a predetermined plane holding the object and a second movable body holding the mask, according to a predetermined temporal change curve of speed and also along a predetermined path, while switching between a first detection signal corresponding to a position of the first movable body output by an interferometer system which detects positional information of the first movable body and a second detection signal corresponding to a position of the first movable body output by an encoder system which detects positional information of the first movable body that serves as a drive signal, by making the first detection signal and the second detection signal pass through a high pass filter and a low pass filter that have the same cutoff frequency, respectively; and performing a weighting of a first drive period in which the at least one movable body is driven based on the first detection signal and a second drive period in which the at least one movable body is driven based on the second detection signal by setting the cutoff frequency.

According to this method, at least one of the first movable body and the second movable body holding the mask can be driven according to a predetermined temporal change curve of speed and also along a predetermined path based on the drive signal, while switching between the first detection signal corresponding to a position of the first movable body output by an interferometer system which detects positional information of the first movable body and the second detection signal corresponding to a position of the first movable body output by an encoder system which detects positional information of the first movable body that serves as the drive signal, and it becomes possible to set the first drive period and the second drive period according to their weight.

According to a seventh aspect of the present invention, there is provided a device manufacturing method, including forming a pattern on an object by the exposure method according to the present invention; and developing the object on which the pattern is formed.

According to an eighth aspect of the present invention, there is provided a second exposure apparatus which irradiates an energy beam on a mask on which a pattern is formed, and transfers the pattern on an object, the apparatus comprising: a first movable body which holds the object and moves along a predetermined plane; a second movable body which moves holding the mask; a first measurement system which outputs a first detection signal corresponding to a position of the first movable body obtained by receiving a return beam of a measurement beam via an optical member provided on the first movable body; a second measurement system which outputs a second detection signal by irradiating a measurement beam on a diffraction grating on a measurement plane parallel to the predetermined plane provided on one of the first movable body and an outside of the first movable body and receiving a diffraction beam from the diffraction grating, and has at least a part of the system placed on the other of the first movable body and an outside of the first movable body; and a movable body drive system which drives at least one of the first movable body and the second movable body, based on a synthesized signal of a first signal which is the first detection signal that has passed through a high pass filter and a second signal which is the second detection signal that has passed through a low pass filter having the same cutoff frequency as the high pass filter, and a signal which is substantially equivalent to the synthesized signal.

According to this apparatus, by the movable body drive system, at least one of the first movable body and the second movable body is driven based on a synthetic signal (or a signal substantially equivalent to the synthetic signal) of a first signal which is the first detection signal that has been made to pass through the high pass filter and a second signal which is the second detection signal that has been made to pass through the low pass filter (which has the same cutoff frequency as the high pass filter). Therefore, in the case the frequency of the first and second detection signals is higher than a predetermined cutoff frequency, at least one of the first movable body and the second movable body is driven based on the first detection signal of the first measurement system having high linear measurement, whereas in the case when the first and second detection signals is lower, the movable body is driven based on the second detection signal of the second measurement system having high measurement reproducibility. This makes it possible to transfer and form a pattern with an accurate overlay in a predetermined area (pattern formation area) on an object.

According to the ninth aspect of the present invention, there is provided a third exposure apparatus that synchronously moves a mask and an object in a predetermined direction while irradiating an energy beam on the mask on which a pattern is formed, and transfers the pattern onto the object, the apparatus comprising: a first movable body which holds the object and moves along a predetermined plane; a second movable body which moves holding the mask; an interferometer system which detects positional information of the first movable body, and outputs a first detection signal corresponding to the position of the first movable body; an encoder system which detects positional information of the first movable body, and outputs a second detection signal corresponding to the position of the first movable body; a drive system which drives at least one of the first movable body and the second movable body, according to a predetermined temporal change curve of speed and also along a predetermined path, while switching between the first detection signal and the second detection signal that serves as a drive signal, by making the first detection signal and the second detection signal pass through a high pass filter and a low pass filter that have the same cutoff frequency, respectively; and a setting device which performs a weighting of a first drive period in which the at least one movable body is driven based on the first detection signal and a second drive period in which the at least one movable body is driven based on the second detection signal by setting the cutoff frequency.

According to this apparatus, at least one of the first movable body and the second movable body holding the mask can be driven according to a predetermined temporal change curve of speed and also along a predetermined path based on the drive signal, while switching between the first detection signal corresponding to a position of the first movable body output by an interferometer system which detects positional information of the first movable body and the second detection signal corresponding to a position of the first movable body output by an encoder system which detects positional information of the first movable body that serves as the drive signal, and it becomes possible to set the first drive period and the second drive period according to their weight.

According to the tenth aspect of the present invention, there is provided a device manufacturing method, including forming a pattern on an object using the exposure apparatus of the present invention, and developing the object on which the pattern is formed.

BRIEF DESCRIPTION OF THE DRAWINGS

In the accompanying drawings;

FIG. 3 is a planar view that shows a placement of a stage device and an interferometer which exposure apparatus of FIG. 1 is equipped with;

FIG. 4 is a planar view that shows a placement of a stage device and a sensor unit which exposure apparatus of FIG. 1 is equipped with;

FIG. 6 is a block diagram used to explain input/output relations of a main controller which the exposure apparatus of FIG. 1 is equipped with;

FIG. 10 is a view showing a frequency characteristic of a high pass filter and a low pass filter;

FIGS. 11A to 11C are views used to explain a principle of synthesizing an output signal of an interferometer and an output signal of the encoder and making a hybrid signal;

DESCRIPTION OF THE EMBODIMENTS

First Embodiment

A first embodiment will be described below, with reference to FIGS. 1 to 13C.

Figure 1:
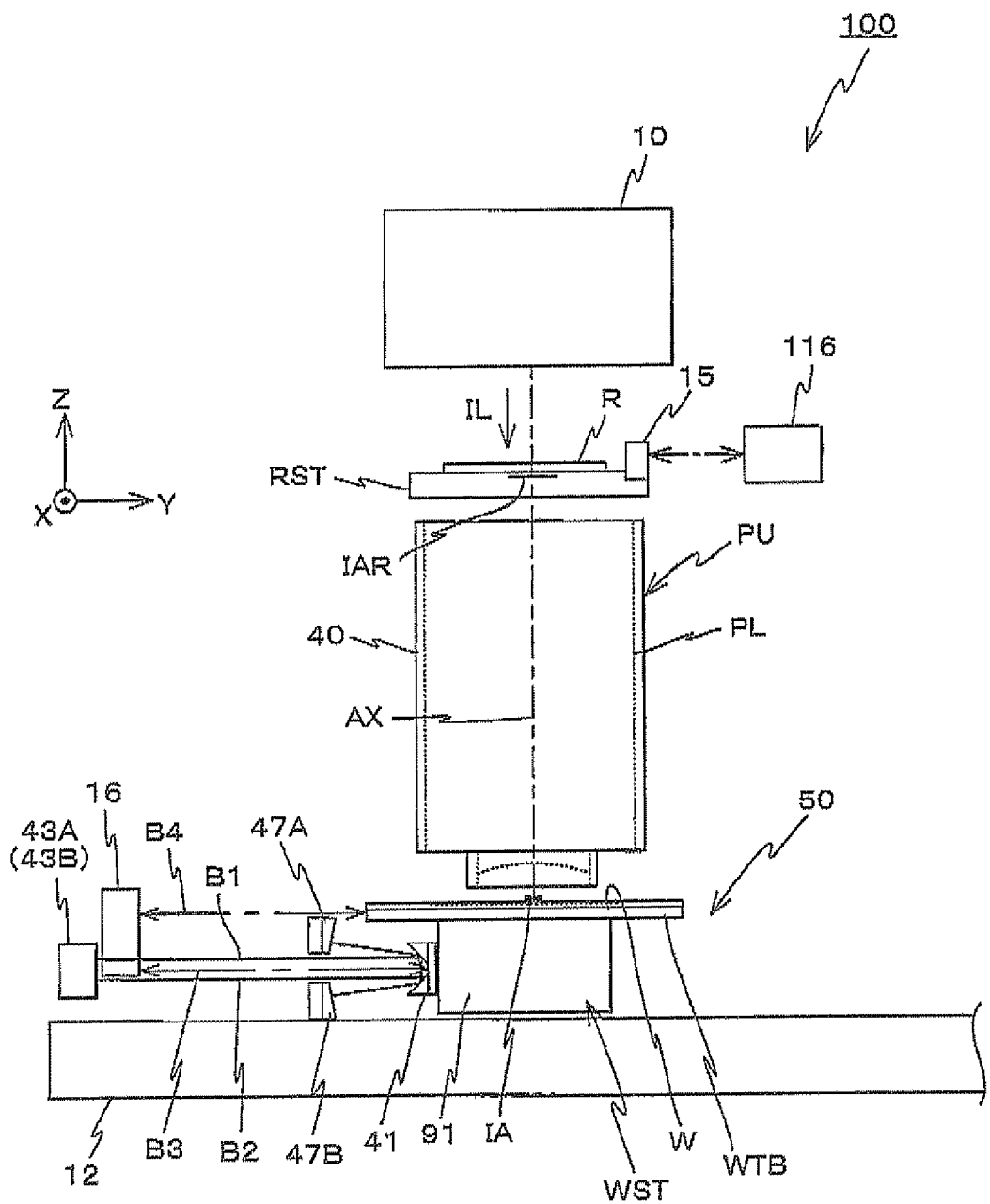
FIG. 1 is a view schematically showing the configuration of an exposure apparatus related to an embodiment.

FIG. 1 schematically shows a configuration of an exposure apparatus 100 related to the first embodiment. Exposure apparatus 100 is a projection exposure apparatus by a step-and-scan method, which is a so-called scanner. As it will be described later on, a projection optical system PL is provided in exposure apparatus 100. In the description below, a direction parallel to an optical axis AX of projection optical system PL will be described as the Z-axis direction, a scanning direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as $\theta x$, $\theta y$, and $\theta z$ directions, respectively.

Exposure apparatus 100 is equipped with an illumination system 10, a reticle stage RST, a projection unit PU, a stage device 50 having a wafer stage WST, and a control system of these parts. In FIG. 1, wafer W is mounted on wafer stage WST.

Illumination system 10 lights up illumination domain IAR of the form of slit in reticle R done setting (a limit) of in a reticle blind (a masking system) in approximately uniform illumination by illuminating ray (exposing light) IL. A configuration of illumination system 10 is disclosed in, for example, U.S. Patent Application Publication No. 2003/0025890 and the like. In this case, as illumination light IL, for example, an ArF excimer laser beam (wavelength 193 nm) is used.

On reticle stage RST, reticle R having a pattern surface (the lower surface in FIG. 1) on which a circuit pattern and the like are formed is fixed by, for example, vacuum adsorption. Reticle stage RST is finely drivable within an XY plane, for example, by a reticle stage drive section 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a predetermined scanning speed.

Positional information (including rotation information in the $\theta z$ direction) of reticle stage RST in the XY plane is constantly detected, for example, at a resolution of around 0.25 nm by a reticle laser interferometer (hereinafter referred to as a "reticle interferometer") 116, via a movable mirror 15 (or a reflection surface formed on an edge surface of reticle stage RST). The measurement values of reticle interferometer 116 are sent to a main controller 20 (not shown in FIG. 1, refer to FIG. 6). Incidentally, positional information of reticle stage RST can be measured using the encoder disclosed in, for example, U.S. Patent Application Publication No. 2007/0288121, instead of using a reticle interferometer.

Projection unit PU is placed below reticle stage RST in FIG. 1. Projection unit PU includes a barrel 40 and projection optical system PL held within barrel 40. As projection optical system PL, for example, a dioptric system that is composed of a plurality of optical elements (lens elements) that are disposed along optical axis AX parallel to the Z-axis direction is used. Projection optical system PL is, far example, both-side telocentric and has a predetermined projection magnification (e.g. one-quarter, one-fifth, one-eighth times, or the like) n Therefore, when illumination system 10 illuminates illumination area IAR on reticle R, by illumination light IL which has passed through reticle R placed so that its pattern surface substantially coincides with a first surface (object surface) of projection optical system PL, a reduced image of the circuit pattern of reticle R within illumination area IAR via projection optical system PL (projection unit PU) is formed on an area (hereinafter also referred to as an exposure area) IA conjugate with illumination area IAR on a wafer W whose surface is coated with a resist (sensitive agent) and is placed on a second surface (image plane surface) side of projection optical system PL. And by reticle stage RST and wafer stage WST being synchronously driven, reticle R is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of reticle R is transferred onto the shot area That is, the pattern of reticle R is generated on wafer W according to illumination system 10 and projection optical system PL, and then by the exposure of the sensitive layer (resist layer) on wafer W with illumination light IL, the pattern is formed on wafer W.

Figure 6:
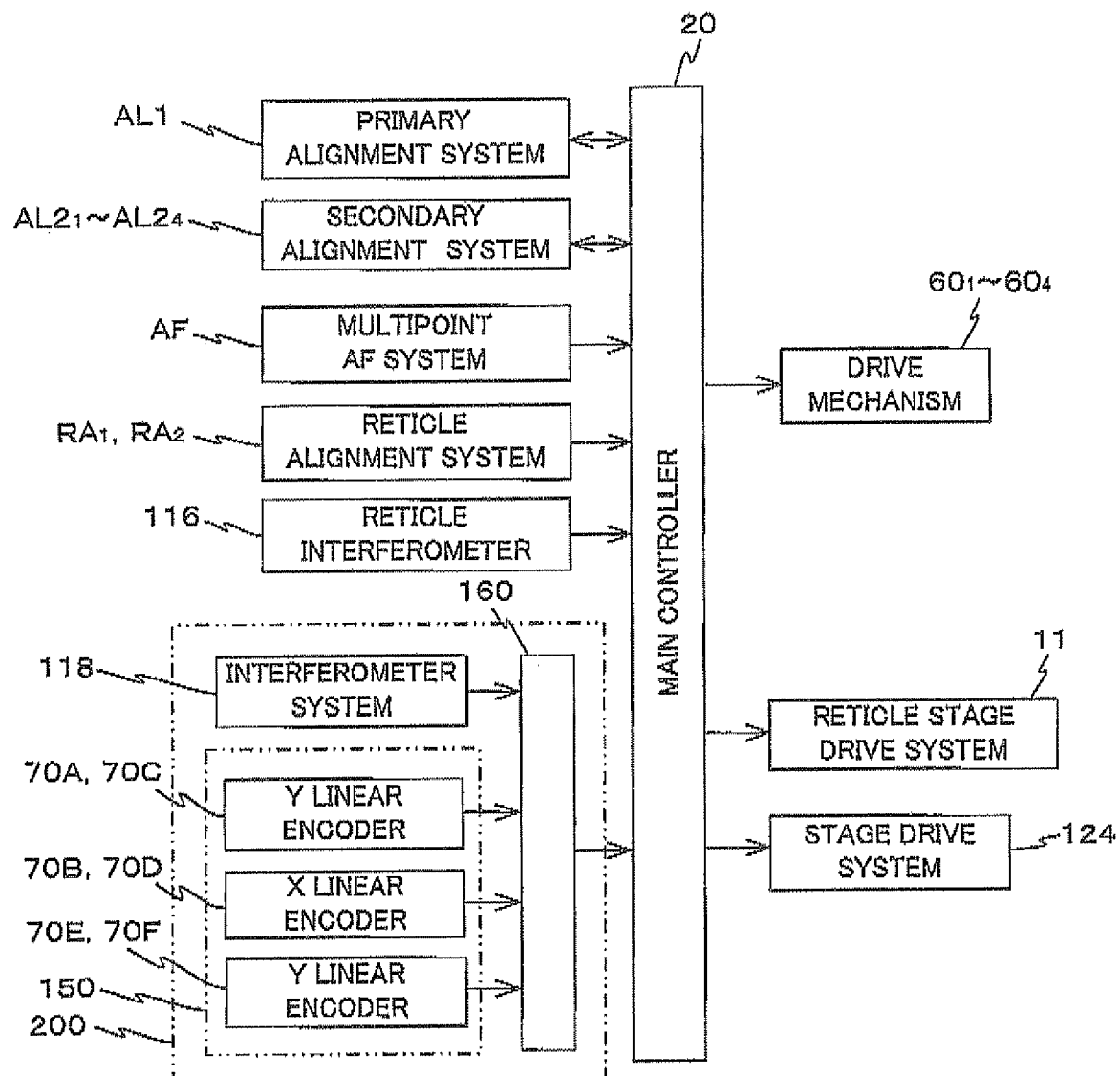

As shown in FIG. 1, stage device 50 is equipped with a wafer stage WST placed on a base board 12, a measurement system 200 (refer to FIG. 6) which measures positional information of wafer stage WST, a stage drive system 124 (refer to FIG. 6) which drives wafer stage WST, and the like. Measurement system 200 includes an interferometer system 118 and an encoder system 150, as shown in FIG. 6.

Wafer stage WST is supported on base board 12, via a clearance gap (gap, clearance) of around several µm by non-contact bearings (not shown), such as, for example, air bearings and the like. Further, wafer stage WST is drivable in predetermined strokes in the X-axis direction and the Y-axis direction, by stage drive system 124 (refer to FIG. 6) which includes a linear motor and the like.

Wafer stage WST includes a stage main section 91, and a wafer table WTB that is mounted on stage main section 91. Wafer table WTB and stage main section 91 are configured drivable in the X-axis direction, the Y-axis direction, the Z-axis direction, the $\theta x$ direction, the $\theta y$ direction, and the $\theta z$ direction (hereinafter described as directions of six degrees of freedom, or directions of six degrees of freedom (X, Y, Z, $\theta x$, $\theta y$, and $\theta z$)) with respect to base board 12, for example, by a drive system including a linear motor and a Z leveling mechanism (including a voice coil motor and the like).

Figure 2:
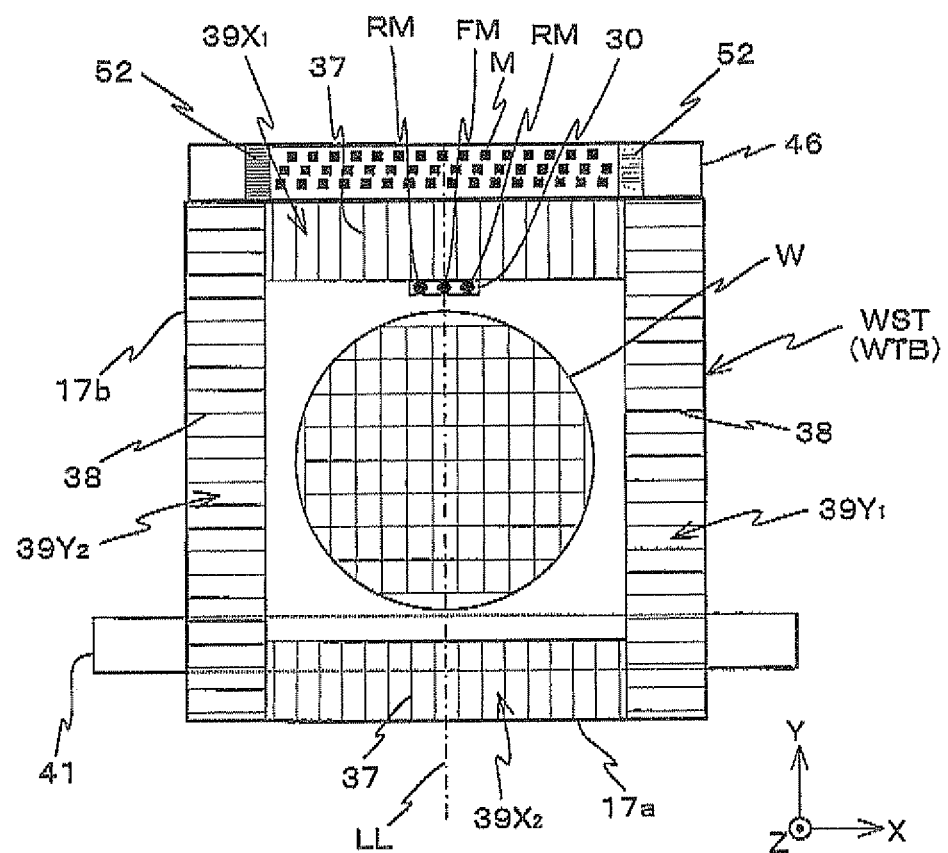
FIG. 2 is a planar view that shows a wafer stage.

In the center of the upper surface of wafer table WTB, a wafer holder (not shown) is arranged which holds wafer W by vacuum suction or the like. As shown in FIG. 2, on the +Y side of the wafer holder (wafer W) on the upper surface of wafer table WTB, a measurement plate 30 is provided. In measurement plate 30, a fiducial mark FM used for wafer alignment is provided in the center, and on both sides of fiducial mark FM in the X-axis direction, a pair of reference marks RM is provided.

Further, on the upper surface of wafer table WTB, a scale used by an encoder system described below is formed. More specifically, in areas on one side and the other side in the X-axis direction (both sides in the horizontal direction of the page surface in FIG. 2) on the upper surface of wafer table WTB, Y scales $39Y_1$ and $39Y_2$ are formed, respectively. Y scales $39Y_1$ and $39Y_2$ are each composed of a reflective grating (for example, a diffraction grating) having a periodic direction in the Y-axis direction in which grid lines 38 whose longitudinal direction is in the X-axis direction are arranged in a predetermined pitch along the Y-axis direction.

Similarly, in areas on one side and the other side in the Y-axis direction (both sides in the vertical direction of the page surface in FIG. 2) on the upper surface of wafer table WTB, X scales $39X_1$ and $39X_2$ are formed, respectively, in a state where the scales are placed between Y scales $39Y_1$ and $39Y_2$. X scales $39X_1$ and $39X_2$ are composed of a reflective grating (for example, a diffraction grating) having a periodic direction in the X-axis direction in which grid lines 37 having the longitudinal direction in the Y-axis direction are arranged in a predetermined pitch along the X-axis direction.

Incidentally, the pitch of grid lines 37 and 38, for example, is set to 1 μm. In FIG. 2 and other drawings, the pitch of the gratings is illustrated larger than the actual pitch for the sake of convenience.

Further, in order to protect the diffraction grating, it is also effective to cover the grating with a glass plate with low thermal expansion. In this case, as the glass plate, a plate whose thickness is the same level as the wafer, such as for example, a plate 1 mm thick, can be used, and the plate is set on the upper surface of wafer table WTB so that the surface of the glass plate becomes the same height (flush) as the wafer surface.

Further, on the −Y end surface and the −X end surface of wafer table WTB, as shown in FIG. 2, a reflection surface 17a and a reflection surface 17b used in the interferometer system to be described later) are formed.

Further, on a surface on the +Y side of wafer table WTB, a fiducial bar (hereinafter, shortly referred to as an "FD bar") 46 extending in the X-axis direction is attached as shown in FIG. 2, similar to the CD bar disclosed in, for example, U.S. Patent Application Publication No. 2008/0088843. In the vicinity of the end portions on one side and the other side in the longitudinal direction of FD bar 46, a reference grating (for example, a diffraction grating) 52 whose periodic direction is the Y-axis direction is respectively formed, placed symmetric to a center line LL. Further, on the upper surface of FD bar 46, a plurality of reference marks M is formed. As each of the reference marks M, a two-dimensional mark is used having a size that can be detected by an alignment system (to be described later).

Figure 3:
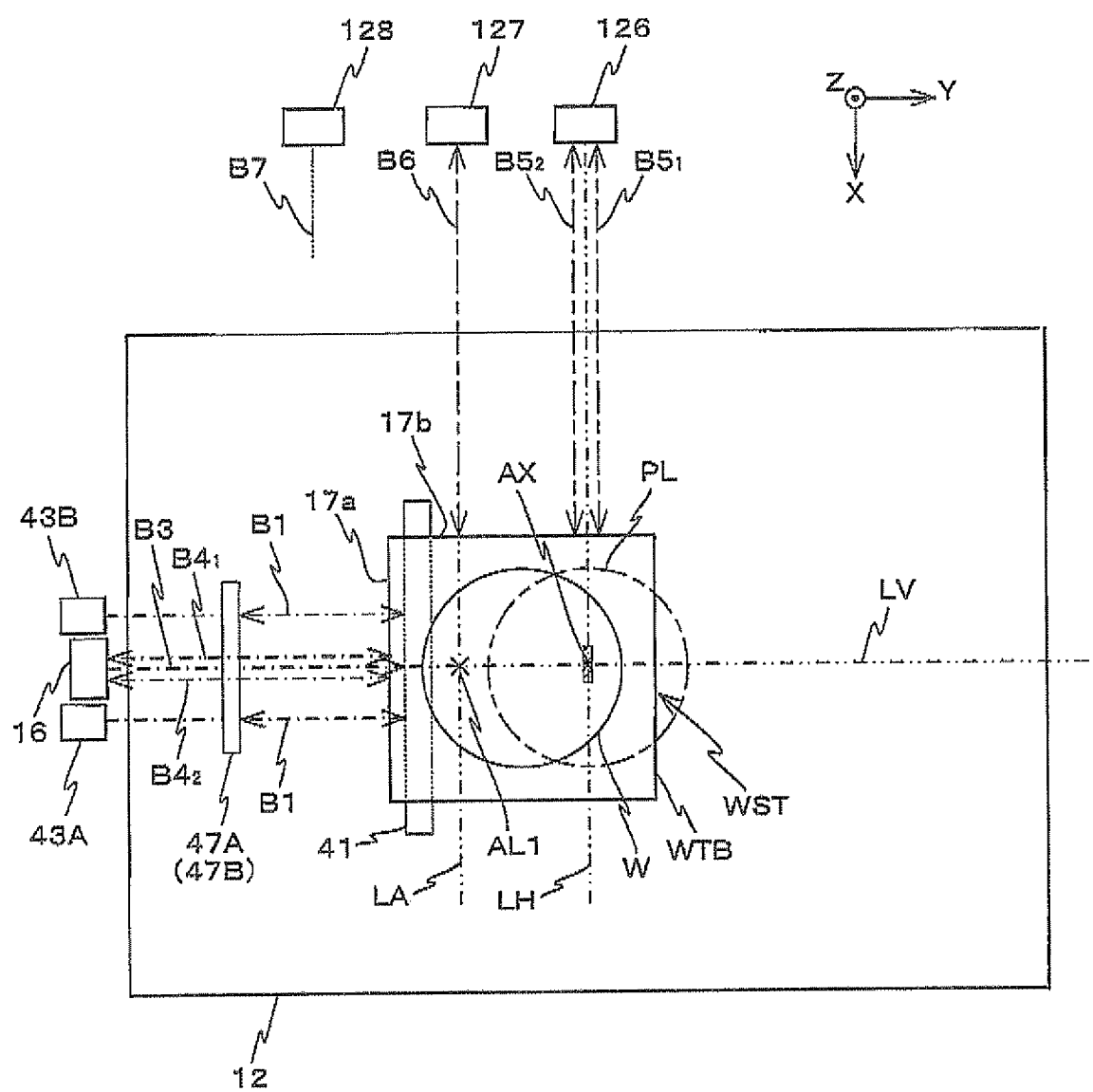
Figure 4:
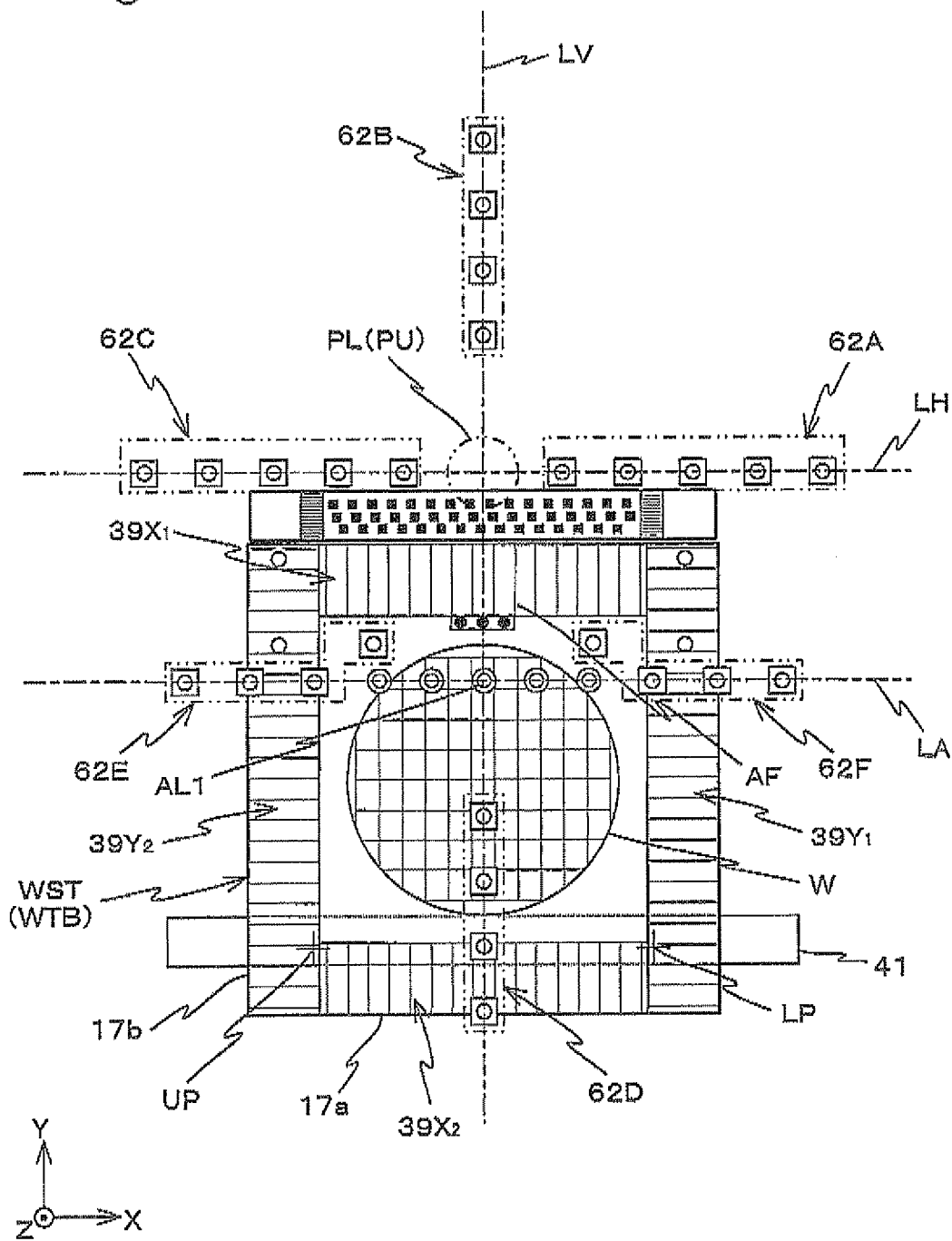
Figure 5:
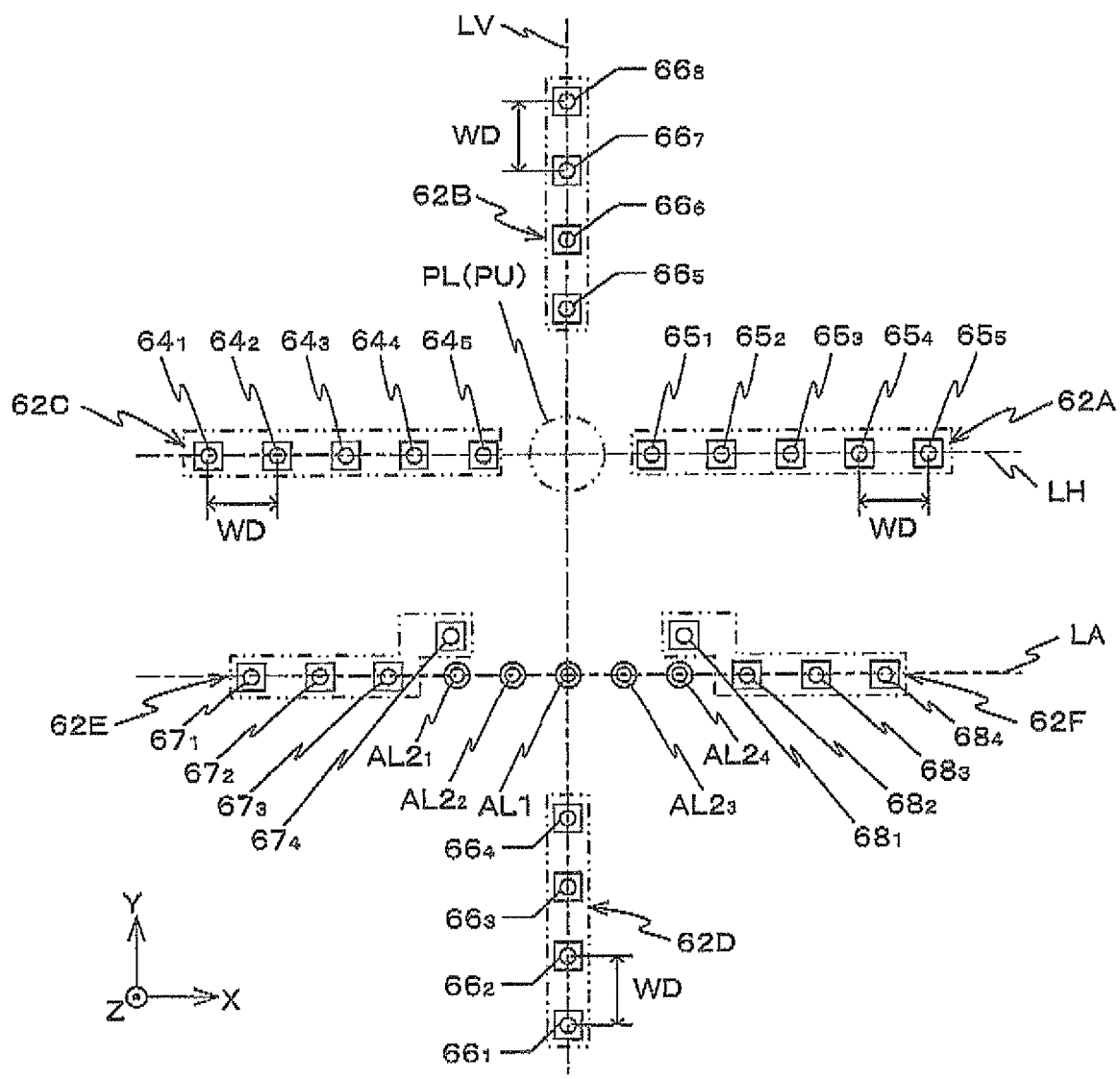
FIG. 5 is a planar view showing a placement of encoder heads (an X head and a Y head) and an alignment system.

In exposure apparatus 100, a primary alignment system AL1 is provided which has a detection center at a position spaced apart by a predetermined distance to the −Y side from optical axis AX, on a straight line (hereinafter referred to as a reference axis) LV parallel to the Y-axis passing through optical axis AX of projection optical system PL, as shown in FIGS. 3 and 4. Primary alignment system AL1 is fixed to the lower surface of the mainframe not shown). As shown in FIG. 5, on one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to reference axis LV are severally arranged. Secondary alignment systems $AL2_1$ to $AL2_4$ are fixed via a movable support member to the lower surface of the mainframe (not shown), and by using drive mechanisms $60_1$ to $60_4$ (refer to FIG. 6), the relative position of the detection areas can be adjusted in the X-axis direction.

In exposure apparatus 100, as each of alignment systems AL1 and $AL2_1$ to $AL2_4$, for example, an FIA (Field Image Alignment) system by an image processing method is used The imaging signals from each of alignment systems AL1 and $AL2_1$ to $AL2_4$ are supplied to main controller 20, via a signal processing system (not shown).

Moreover, in exposure apparatus 100, a multiple point focal point position detection system (hereinafter shortly referred to as a multipoint AF system) AF (not shown in FIG. 1, refer to FIG. 6) by the oblique incidence method having a similar configuration as the one disclosed in, for example, U.S. Pat. No. 5,448,332 and the like, is arranged in the vicinity of projection unit PU. Detection signals of multipoint AF system AF are supplied to main controller 20 (refer to FIG. 6) via an AF signal processing system (not shown). Main controller 20 detects positional information (surface position information) of the wafer W surface in the Z-axis direction at a plurality of detection points of the multipoint AF system AF based on detection signals of multipoint AF system AF, and performs a so-called focus leveling control of wafer W during the scanning exposure based on the detection results. Incidentally, positional information (unevenness information) of the wafer W surface can be acquired in advance at the time of wafer alignment (EGA) by arranging the multipoint AF system in the vicinity of alignment systems AL1, and $AL2_1$ to $AL2_4$, and at the time of exposure, the so-called focus leveling control of wafer W can be performed, using the surface position information and measurement values of an interferometer system 118 (refer to FIG. 6) which will be described later one Incidentally, instead of interferometer system 118, measurement values of the encoder system which can measure the Z position can also be used in the focus leveling control.

Further, above reticle stage RST, as disclosed in detail in, for example, U.S. Pat. No. 5,646,413 and the like, a pair of reticle alignment systems $RA_1$ and $RA_2$ by an image processing method, each of which has an imaging device such as a CCD and uses light with an exposure wavelength (illumination light IL in the present embodiment) as alignment illumination light, are placed (in FIG. 1, reticle alignment system $RA_2$ hides behind reticle alignment system $RA_1$ in the depth of the page surface). The pair of reticle alignment systems $RA_1$ and $RA_2$ is used in a reticle alignment to be described later (in the embodiment, reticle alignment also serves as a latter processing of a baseline check of primary alignment system AL1) by main controller 20, in a state where measurement plate 30 is positioned directly below projection optical system PL, to detect a positional relation between a projection image of a pair of reticle alignment marks (omitted in drawings) formed on reticle R and a corresponding pair of reference marks RM on measurement plate 30. The detection signals of reticle alignment systems $RA_1$ and $RA_2$ are supplied to main controller 20 (refer to FIG. 6) via a signal processing system that is not illustrated. Incidentally, reticle alignment systems $RA_1$ and $RA_2$ do not have to be arranged. In this case, it is desirable for wafer table WTB to have a detection system in which a light transmitting section (light-receiving section) is installed, to detect the projection image of the reticle alignment mark, as disclosed in, for example, U.S. Patent Application Publication No. 2002/0041377 and the like.

As shown in FIG. 3, interferometer system 118 is equipped with a Y interferometer 16, three X interferometers 126 to 128, and a pair of Z interferometers 43A and 43B that irradiate interferometer beams (measurement beams) on reflection surfaces 17a or 17b, respectively, and receive the reflected light.

To enter the details, Y interferometer 16 irradiates at least three measurement beams parallel to the Y-axis including a pair of measurement beams $B4_1$ and $B4_2$ which is symmetric with respect to reference axis LV on reflection surface 17a and a movable mirror 41 to be described later on). Further, X interferometer 126 irradiates at least three measurement beams parallel to the X-axis including a pair of measurement beams $B5_1$ and $B5_2$ which is symmetric with respect to a straight line (hereinafter referred to as a reference axis) LH orthogonal to optical axis AX and reference axis LV and parallel to the X-axis on reflection surface 17b, as shown in FIG. 3. Further, X interferometer 127 irradiates at least two measurement beams parallel to the Y-axis including a measurement beam B6 whose measurement axis is a straight line (hereinafter referred to as a reference axis) LA which is orthogonal to reference axis LV at the detection center of alignment system AL1 and is parallel to the X-axis, on reflection surface 17b. Further, X interferometer 128 irradiates a measurement beam B7 which is parallel to the Y-axis on reflection surface 17b.

Each interferometer configuring interferometer system 118 receives the return beam from a corresponding reflection surface, and supplies an intensity signal (an output signal) of the return beam (or to be more precise, an interference beam of the measurement beam (measurement beam) and the reference beam) to main controller 20 (refer to FIG. 6), via a signal processing device 160 (refer to FIG. 6). Main controller 20 obtains displacement of wafer table WTB (wafer stage WST) related to each measurement direction using the output signal of each interferometer which has been supplied, and obtains positional information (including rotation in the X, Y, and θz directions (yawing), rotation in the θx direction (pitching), and rotation in the θy direction (rolling) as well) of wafer table WTB (wafer stage WST) using the displacement information.

Further, as shown in FIG. 1, movable mirror 41 having a concave-shaped reflection surface is attached to the side surface on the −Y side of stage main section 91. As it can be seen from FIG. 2, the length in the X-axis direction of movable mirror 41 is longer than reflection surface 17a of wafer table WTB.

A pair of Z interferometers 43A and 43B (refer to FIGS. 1 and 3) that configures a part of interferometer system 118 (refer to FIG. 6) is arranged facing movable mirror 41. Z interferometers 43A and 43B, for example, irradiate two measurement beams B1 and B2 that are parallel to the Y-axis on fixed mirrors 47A and 47B, respectively, which are fixed on the mainframe (not shown) supporting projection unit PU, via movable mirror 41. And by receiving each reflected light, Z interferometers 43A and 43B measure the optical path length of measurement beams B1 and B2. The results are sent to main controller 20 (refer to FIG. 6) via signal processing device 160, and positional information of wafer stage WST in directions of four degrees of freedom (in each of the Y-axis, Z-axis, θy, and θz directions) is obtained. The computation method of the position of the wafer stage based on Z interferometers 43A and 43B and the measurement values is disclosed in detail, for example, in U.S. Patent Application Publication No. 2009/0040488.

In exposure apparatus 100 of the embodiment, a plurality of head units configuring encoder system 150 to measure the position of wafer stage WST within the XY plane, or in other words, the position (hereinafter shortly referred to as position (X, Y, θz) in the XY plane, as appropriate) in each of the X-axis, the Y-axis, and the θz directions, is provided, independently from interferometer system 118.

As shown in FIG. 4, four head units 62A, 623, 62C and 62D are placed on the +X side, the +Y side, and the −X side of projection unit PU, and the −Y side of primary alignment system AL1, respectively. Further, head units 62E and 62F are provided, respectively, on the outer side on both sides in the X-axis direction of alignment system AL1 and $AL2_1$ to $AL2_4$.

Head units 62A to 62F are fixed to the mainframe (not shown) holding projection unit PU in a suspended state, via a support member. Further, in FIG. 4, a reference code UP indicates an unloading position where a wafer on wafer table WTB is unloaded, and a reference code LP indicates a loading position where a new wafer is loaded on wafer stage WST.

Head units 62A and 62C are equipped with a plurality of (five, in this case) Y heads $65_1$ to $65_5$ and $64_1$ to $64_5$, as shown in FIG. 5, respectively, which are placed on reference axis LH previously described at a predetermined distance. Hereinafter, heads $65_1$ to $65_5$ and heads $64_1$ to $64_5$ will also be described as head 65 and head 64, respectively, as necessary.

Head units 62A and 62C respectively constitute multiple-lens Y linear encoders 70A and 70C (refer to FIG. 6) that measure the position (Y position) of wafer stage WST (wafer table WTB) in the Y-axis direction, using Y scales $39Y_1$ and $39Y_2$. Incidentally, in the description below, the Y linear encoders will be shortly described as "Y encoder" or "encoder," appropriately.

As shown in FIG. 5, head unit 62B is placed on the +Y side of projection unit PU, and is equipped with a plurality of (in this case, four) X heads $66_5$ to $66_8$ that are placed on reference axis LV at a distance WD. Further, head unit 62D is placed on the −Y side of primary alignment system AL1, and is equipped with a plurality of (in this case, four) X heads $66_1$ to $66_4$ that are placed on reference axis LV at distance WD. In the following description, X heads $66_5$ to $66_8$ and X heads $66_1$ to $66_4$ are also described as X head 66, when necessary.

Head units 62B and 62D respectively constitute multiple-lens Y linear encoders 70B and 70D (refer to FIG. 6) that measure the position (X position) of wafer stage WST (wafer table WTB) in the X-axis direction, using X scales $39X_1$ and $39X_2$. Incidentally, in the description below, the X linear encoders will be shortly described as "X encoder" or "encoder," appropriately.

Figure 7A:
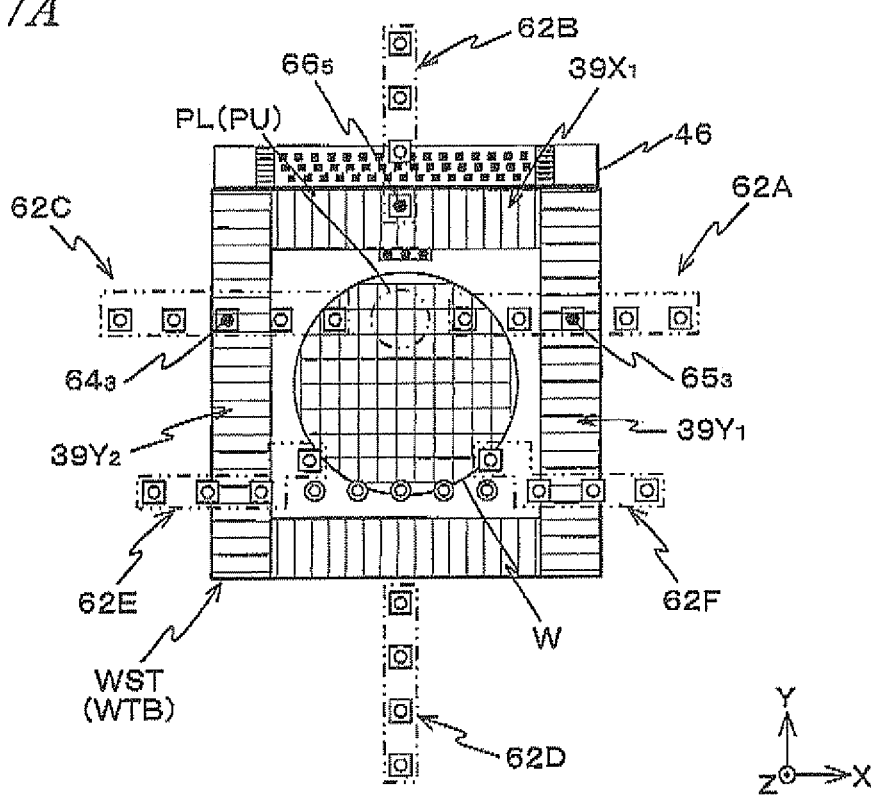
FIG. 7A is a view showing an example of position measurement of a wafer stage using an encoder during an exposure operation.

Distance WD in the X-axis direction of each of the five Y heads 65 and 64 (to be more accurate, the irradiation point on the scale of the measurement beam generated by Y heads 65 and 64) that head units 62A and 62C are equipped with, here, is decided so that on exposure and the like, at least one head constantly faces (irradiates a measurement beam on) the corresponding Y scales $39Y_1$ and $39Y_2$. Similarly, distance WD in the Y-axis direction of each of the adjacent X heads 66 (to be more accurate, the irradiation point on the scale of the measurement beam generated by X heads 66) that head units 628 and 62D are equipped with, is decided so that on exposure and the like, at least one head constantly faces (irradiates a measurement beam on) the corresponding X scale $39Y_1$ or $39X_2$. FIG. 7A shows a state during the exposure operation, and in this state, Y heads $65_3$ and $64_3$ face Y scales $39Y_1$ and $39Y_2$, respectively, and X head $66_5$ faces (irradiates a measurement beam on) X scale $39X_1$.

Incidentally, the distance between X head $66_5$ farthest to the −Y side of head unit 62B and X head $66_4$ farthest to the +Y side of head unit 62D is set slightly narrower than the width of wafer table WTB in the Y-axis direction so that switching (linkage described below) becomes possible between the two X heads when wafer stage WST moves in the Y-axis direction.

Head unit 62E is equipped with a plurality of (in this case, four) Y heads $67_1$ to $67_4$, as shown in FIG. 5.

Head unit 62F is equipped with a plurality of (in this case, four) Y heads $68_1$ to $68_4$. Y heads $68_1$ to $68_4$ are placed at positions symmetric to Y heads $67_4$ to $67_1$ with respect to reference axis LV. Hereinafter, Y heads $67_1$ to $67_4$ and Y heads $68_1$ to $68_4$ will also be described as Y head 67 and Y head 68, as necessary.

Figure 7B:
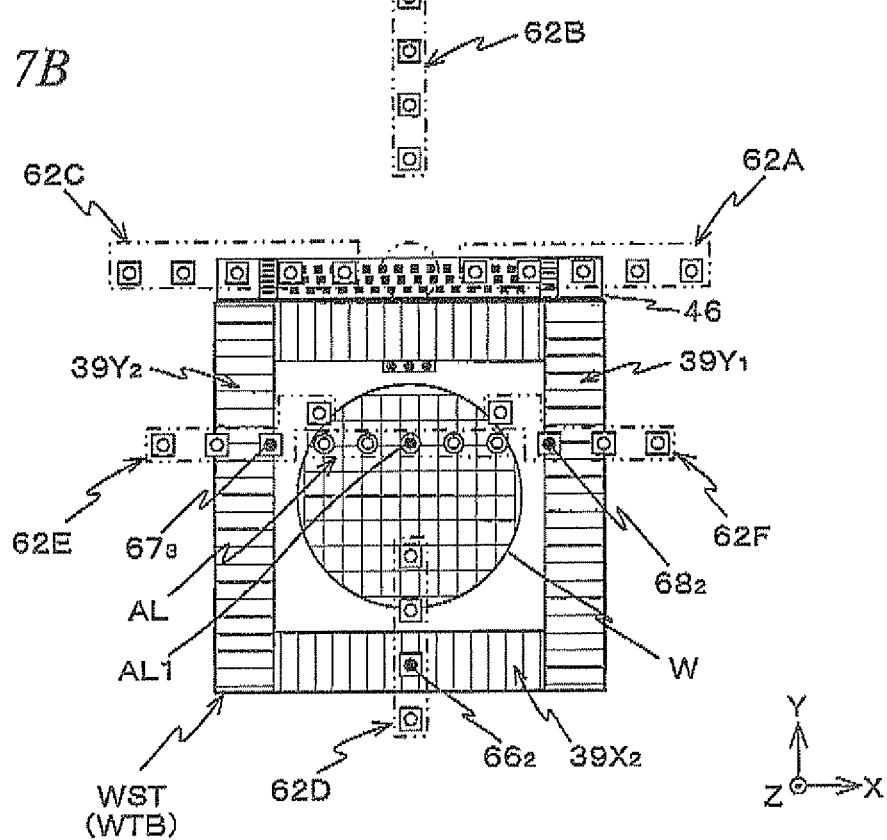
FIG. 7B is a view showing an example of position measurement of a wafer stage using an encoder during an alignment measurement.

On alignment measurement and the like, at least one each of Y heads 67 and 68 face Y scales $39Y_2$ and $39Y_1$, respectively. FIG. 7B shows a state during the alignment measurement, and in this state, Y heads $67_3$ and $68_2$ face Y scales $39Y_2$ and $39Y_1$, respectively. The Y position (and θz rotation) of wafer stage WST is measured by Y heads 67 and 68 (more specifically, Y encoders 70E and 70F configured by Y heads 67 and 68).

Further, in the embodiment, at the time of baseline measurement and the like of the secondary alignment system, Y head $67_3$ and $68_2$ which are adjacent to the secondary alignment systems $AL2_1$ and $AL2_4$ in the X-axis direction face a pair of reference gratings 52 of FD bar 46, respectively, and by Y heads $67_3$ and $68_2$ that face the pair of reference gratings 52, the position of FD bar 46 is measured at the position of each reference grating 52. In the description below, the encoders configured by Y heads $67_3$ and $68_2$ which face a pair of reference gratings 52, respectively, are referred to as Y linear encoders 70S and 70F (refer to FIG. 6). Further, for identification, the Y encoders configured by Y heads 67 and 68 that face Y scales $39Y_2$ and $39Y_1$, will be referred to as encoders $70E_1$ and $70F_1$.

As the heads of encoders 70A to 70F, as an example, a diffraction interference type encoder head is used, as in the encoder head disclosed in U.S. Pat. No. 7,238,931, or in U.S. Patent Application Publication No. 2007/0288121 and the like.

In the diffraction interference type encoder head, as is known, by a scale (wafer table WTB to which scale $39X_1$, $39X_2$, $39Y_1$ or $39Y_2$ is fixed) moving in the measurement direction (the periodic direction of the diffraction grating), a phase difference between two measurement beams changes, which changes the intensity of the interference light. Accordingly, the positional information of the scale (in other words, wafer table WTB (wafer stage WST)) can be obtained from the intensity change of the interference of light that has been detected.

Each of the encoders 70A to 70F configuring encoder system 150 sends an intensity signal (output signal) of the interference light that has been detected to signal processing device 160 (refer to FIG. 6). Signal processing device 160 processes the output signal, and then sends the signal to main controller 20 (refer to FIG. 8). Main controller 20 obtains the displacement of the scale regarding the measurement direction (the periodic direction of the diffraction grating) using an output signal from each encoder 70A to 70F, and using the displacement information, obtains positional information (including the X, Y positions and rotation in the 82 direction (that is, yawing)) of wafer table WTB (wafer stage WST) Incidentally, details on the signal processing by signal processing device 160 and computation of the positional information (X, Y, and θz positions) by main controller 20 will be described later in the description.

Main controller 20 controls the position of wafer table WTB within the XY plane using three output signals of encoders 70A to 70D, or of encoders $70E_1$, $70F_1$, 70B, and 70D, as well as controls the rotation in the θz direction of FD bar 46 (wafer table WTB) based on the output signals of encoders $70E_2$ and $70F_2$.

FIG. 6 shows a block diagram that shows input/output relations of main controller 20 that is configured of a control system of exposure apparatus 100 as the central component and performs overall control of the respective components. Main controller 20 includes a work station (or a microcomputer), and has overall control over the entire apparatus.

Next, a drive (position control) of wafer stage WST employed in exposure apparatus 100 of the first embodiment which uses a hybrid method by encoder system 150 and interferometer system 118 will be described.

In the drive (position control) of wafer stage WST by the hybrid method in the first embodiment, signal processing device 160 synthesizes (makes) a hybrid signal from an output signal of the interferometer (interferometer system 118) and an output signal of the encoder (encoder system 150) using a high-pass filter and a low-pass filter of a cut-off frequency fc, and wafer stage WST is driven based on the hybrid signal.

Figure 8:
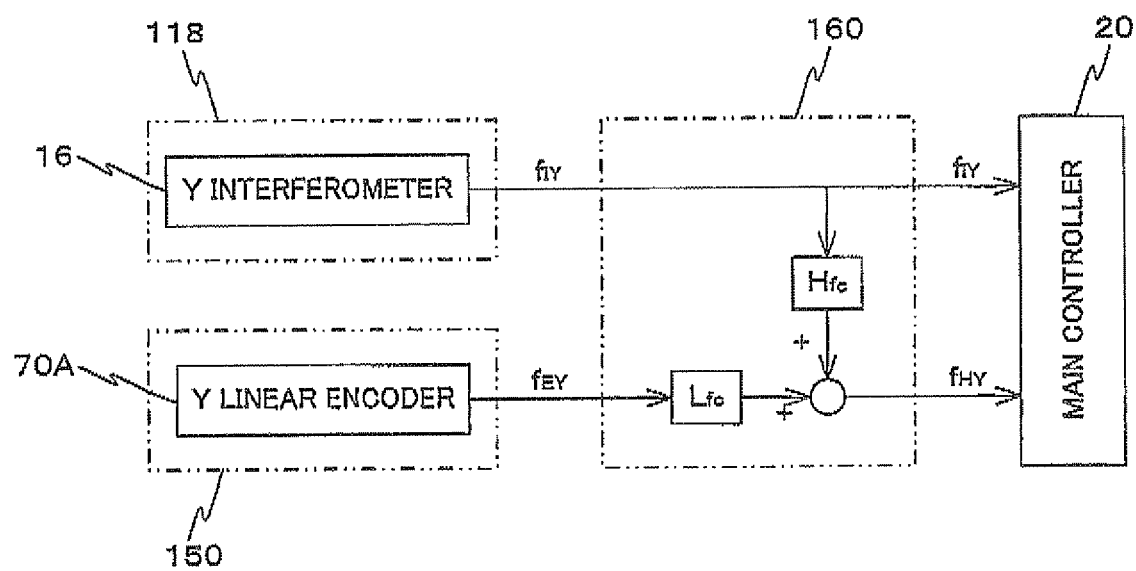
FIG. 8 is a block diagram showing an example of a signal processing device 160 which synthesizes an output signal of an interferometer and an output signal of an encoder and makes a hybrid signal.

FIG. 8 shows an example of signal processing device 160 in a block diagram. Now, the synthesis of the hybrid signal by signal processing device 160 will be described. As an example, here, a case will be considered where a hybrid signal $f_{HY}(t)$ is made by synthesizing an output signal $f_{IY}(t)$ of Y interferometer 16 configuring interferometer system 118 and an output signal $f_{EY}(t)$ of Y linear encoder 70A configuring encoder system 150. Here, Laplace transform $(F(s)=\int_0^\infty f(t) e^{-st}dt)$ of the three signals $f_{IY}(t)$, $f_{EY}(t)$, and $f_{HY}(t)$ will be expressed as $F_{IY}(s)$, $F_{EY}(s)$, and $F_{HY}(s)$, respectively. Incidentally, t is time, $s=i\omega=12\pi f$, and f is frequency.

Incidentally, by placing Y head 65 configuring Y linear encoder 70A in the manner previously described, at least one Y head 65 constantly faces Y scale $39Y_1$. Accordingly, from one of the Y heads 65 facing Y scale $39Y_1$ according to the position of wafer stage WST, an intensity signal of the interference light signal is sent to signal processing device 160 as output signal $f_{EY}(t)$ of Y linear encoder 70A.

Further, the amplitude and phase of each of the output signals of Y heads 65 are to be adjusted so as to coincide with each other. Accordingly, even if Y head 65 is switched according to the position of wafer stage WST, the continuity of output signal $f_{EY}(t)$ of Y linear encoder 70A will be sufficiently secured. Further, the output signal $f_{EY}(t)$ of Y linear encoder 70A and the output signal $f_{IY}(t)$ of Y interferometer 16, respectively, are to be adjusted so that the amplitude, phase, and period (an oscillatory period which results from a measurement unit) coincide with each other.

Signal processing device 160 puts output signal $F_{IY}(s)$ of Y interferometer 16 (interferometer system 118) and output signal $F_{EY}(s)$ of Y linear encoder 70A (encoder system 150), respectively, through high pass filter $H_{fc}(s)$ and low pass filter $L_{fc}(s)$ of cutoff frequency fc, as shown in FIG. 8, and synthesizes the signals. This allows hybrid signal $F_{HY}(s)$ to be obtained in the manner described below.

$$F_{HY}(s)=H_{fc}(s)F_{IY}(s)+L_{fc}(s)F_{EY}(s) \quad (1)$$

As high pass filter $H_{fc}(s)$ and low pass filter $L_{fc}(s)$, for example, RC circuit type filters $H_{fc}(s)=(s/\omega c)/(1+s/\omega c)$ and $L_{fc}(s)=1/(1+s/\omega c)$ can be adopted. However, $\omega c=2\pi fc$. FIG. 10 shows a frequency characteristic (frequency dependency of a gain of an input/output signal) of these filters $H_{fc}(s)$ and $L_{fc}(s)$. High pass filter $H_{fc}(s)$ provides a gain (absolute value) of 1 in a frequency band (f>fc) which is higher than cut-off frequency fc, and provides a gain (absolute value) of 0 in a low frequency band (f<fc). On the other hand, low pass filter $L_{fc}(s)$ provides a gain (absolute value) of 0 in a frequency band (f>fc) which is higher than cut-off frequency fc, and provides a gain (absolute value) of 1 in a low frequency band (f<fc). Incidentally, in this case, because cutoff frequency of high pass filter $H_{fc}(s)$ and low pass filter $L_{fc}(s)$ was equally determined as fc, the following relation is satisfied for an arbitrary frequency f.

$$H_{fc}(s)+L_{fc}(s)=1 \quad (2)$$

Now, high pass filter $H_{fc}(s)$ and low pass filter $L_{fc}(s)$ both provide a gain (absolute value) of 0.5, at frequency f=fc.

Frequency f (oscillatory period 1/f) of output signal $f_{IY}(t)$ of Y interferometer 16 and output signal $f_{EY}(t)$ of Y linear encoder 70A changes in proportion to (inversely proportional to) speed Vy of wafer stage WST in the Y-axis direction. Accordingly, in the case speed Vy is higher than a threshold speed Vc which corresponds to cutoff frequency fc, hybrid signal $F_{HY}(s)$ expressed by formula (1) becomes output signal $F_{IY}(s)$ of Y interferometer 16 that passes through high pass filter $H_{fc}(s)$, and in the case speed Vy is lower than threshold speed Vc, hybrid signal $F^{HY}(s)$ becomes output signal $F_{IY}(s)$ of Y linear encoder 70A that passes through low pass filter $L_{fc}(s)$.

Now, a behavior of hybrid signal $f_{HY}(t)$ to a temporal change of speed Vy of wafer stage WST shown in FIG. 11A will be considered. Wafer stage WST begins acceleration in the Y axis direction at time $t_0(=0)$, and reaches maximum speed Vmax after time Ta+Tb has passed, at time $t_2$. Then, wafer stage WST moves at a constant speed until time Tc has passed, to time $t_3$, and then begins deceleration.

In correspondence with this, output signal $F_{IY}(t)$ of Y interferometer 16 and output signal $f_{EY}(t)$ of Y linear encoder 70A temporally change, as is schematically shown in FIG. 11B. However, inconvenience of illustration, the oscillatory period of output signals $f_{IY}(t)$ and $f_{EY}(t)$ is illustrated much longer than the actual oscillatory period. Further, the measurement results of Y interferometer 16 and Y linear encoder 70A actually include minute measurement errors, however, details of such measurement errors are omitted in FIG. 11B (and in FIG. 11C). Therefore, in FIG. 11B, output signals $f_{IY}(t)$ and $f_{EY}(t)$ overlap each other.

Output signals $f_{IY}(t)$ and $f_{EY}(t)$ begin oscillation due to wafer stage WST, which begins acceleration (speed Vy increases) at time $t_0(=0)$. With the increase of speed Vy, oscillation of output signals $f_{IY}(t)$ and $f_{EY}(t)$ also becomes faster (the oscillatory period becomes shorter), and when speed Vy reaches maximum speed Vmax after time Ta+Tb passes and becomes constant, output signals $f_{IY}(t)$ and $f_{EY}(t)$ perform constant oscillation (the oscillatory period becomes constant 1/fmax) at a maximum frequency fmax which corresponds to maximum speed Vmax.

Here, cut-off frequency fc of high pass filter $H_{fc}(s)$ and low pass filter $L_{fc}(s)$ is to be determined slightly smaller than maximum frequency fmax, as shown in FIG. 11A. As shown in FIG. 11C, from time $t_0(=0)$ until time $t_1$ when frequency f of output signals $f_{IY}(t)$ and $f_{EY}(t)$ coincides with cut-off frequency fc, output signal $f_{IY}(t)$ is cut off by high pass filter $H_{fc}(s)$, and output signal $f_{EY}(t)$ passes through low pass filter $L_{fc}(s)$ and is output as hybrid signal $f_{HY}(t)$. When frequency f exceeds cut-off frequency fc at time $t_1$, output signal $F_{IY}(t)$ is cut off by low pass filter $L_{fc}(s)$, and output signal $f_{IY}(t)$ passes through high pass filter $H_{fc}(s)$ and is output as hybrid signal $f_{HY}(t)$.

Here, the frequency characteristic (gain of input/output signal) of filters $L_{fc}(s)$ and $H_{fc}(s)$ varies continuously with respect to frequency f (refer to FIG. 10), as is previously described. However, in this case, the variation band is set sufficiently narrow. Therefore, it appears that output signal $f_{EY}(t)$ is cut off by low pass filter $L_{fc}(s)$ and the cut off of output signal $f_{IY}(t)$ is cancelled by high pass filter $H_{fc}(s)$ instantly.

By wafer stage WST beginning deceleration (speed Vy decreases) at time $t_3$ after time Ta+Tb+Tc has passed, oscillation of output signal $f_{IY}(t)$ and $f_{EY}(t)$ also becomes slow (the oscillatory period becomes longer). Now, when frequency f becomes smaller than cut-off frequency fc at time $t_4$, as shown in FIG. 11C, output signal $f_{IY}(t)$ is cut off by high pass filter $H_{fc}(s)$ again, and output signal $f_{EY}(t)$ passes through low pass filter $L_{fc}(s)$ and is output as hybrid signal $f_{HY}(t)$.

Furthermore, when speed Vy reaches speed Vy<0 at time $t_5$, oscillation of output signals $f_{IY}(t)$ and $f_{EY}(t)$ is reversed. Further, when frequency f exceeds cut-off frequency -fc (f<fc) at time t6, output signal $f_{EY}(t)$ is cut off by low pass filter $L_{fc}(s)$, and output signal $f_{IY}(t)$ passes through high pass filter $H_{fc}(s)$, and is output as hybrid signal $f_{HY}(t)$.

Figure 12A:
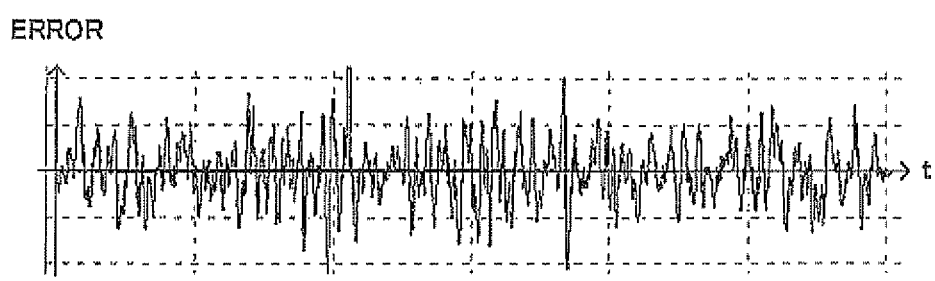
FIG. 12A and 12B are views showing a noise included in a hybrid signal at the time of low frequency and at the time of high frequency, respectively.
Figure 12B:
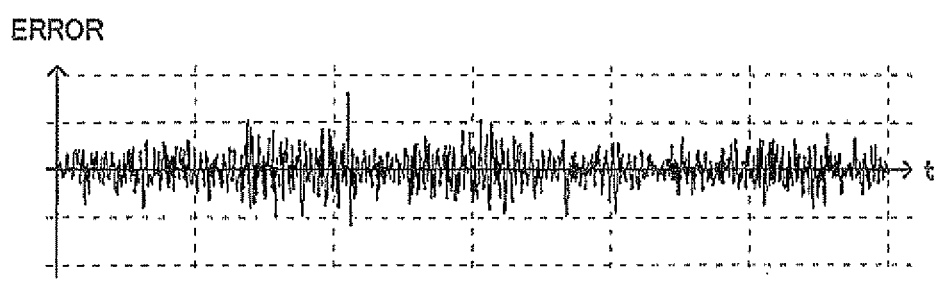

In FIGS. 12A and 12B, as an example, noise included in hybrid signal $f_{HY}(t)$ at the time of low frequency (f<fc) and at the time of high frequency (f>fc) is shown, respectively. It can be seen that the amplitude of the noise becomes small at the time of high frequency, whereas the amplitude is large at the time of low frequency. In other words, at the time of low frequency, noise which is caused by a measurement error (mainly a production error of the scale) of Y linear encoder 70A appears, whereas noise which is caused by a measurement error (a fluctuation error) of Y interferometer 16 appears at the time of high frequency. Incidentally, the amplitude (the scale of the vertical axis of the graph) of the noise is in the order of 1 ppb.

Incidentally, by using $H_{fc}(s)=1-L_{fc}(s)$, which is a transformation of formula (2), formula (1) can be rewritten as follows.

$$F_{HY}(s)=F_{IY}(s)-L_{fc}(s)(F_{IY}(s)-F_{EY}(s)) \quad (3)$$

Figure 9A:
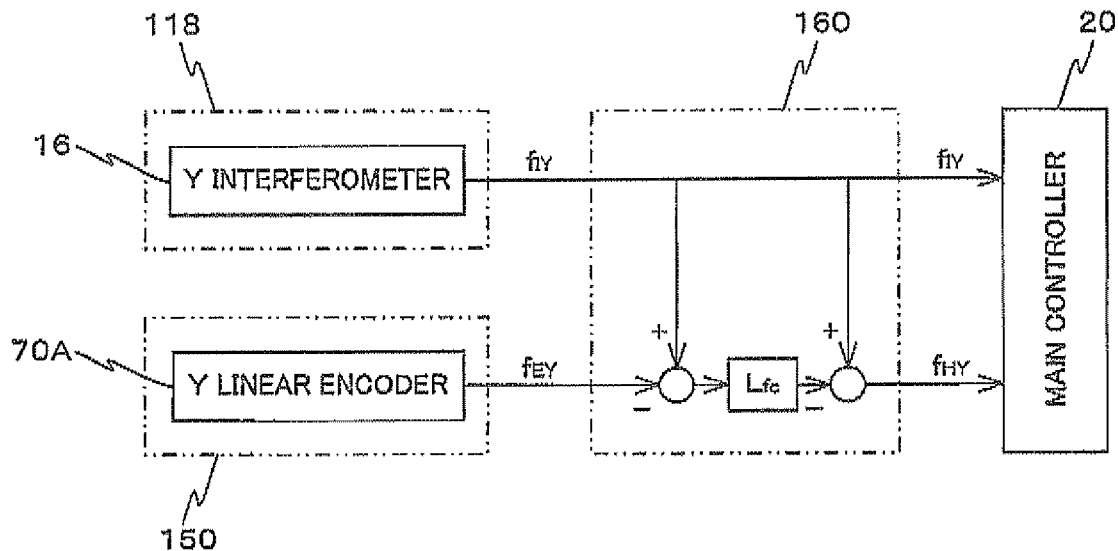
FIGS. 9A and 9E are block diagrams showing other examples of signal processing device 160 that makes the hybrid signal, respectively.

In other words, as shown in FIG. 9A, hybrid signal $F_{HY}(s)$ can also be synthesized by obtaining a difference $F_{IY}(s)-F_{EY}(s)$ which is the difference between output signal $F_{IY}(s)$ and output signal $F_{EY}(s)$ putting the difference through low pass filter $L_{fc}(s)$ of cutoff frequency fc, and then by further obtaining a difference between the difference and output signal $F_{IY}(s)$.

Further, by using $L_{fc}(s)=1-H_{fc}(s)$, which is a transformation of formula (2), formula (1) can be rewritten as follows.

$$F_{HY}(s)=F_{EY}(s)-H_{fc}(s)(F_{IY}(s)-F_{EY}(s)) \quad (4)$$

Figure 9B:
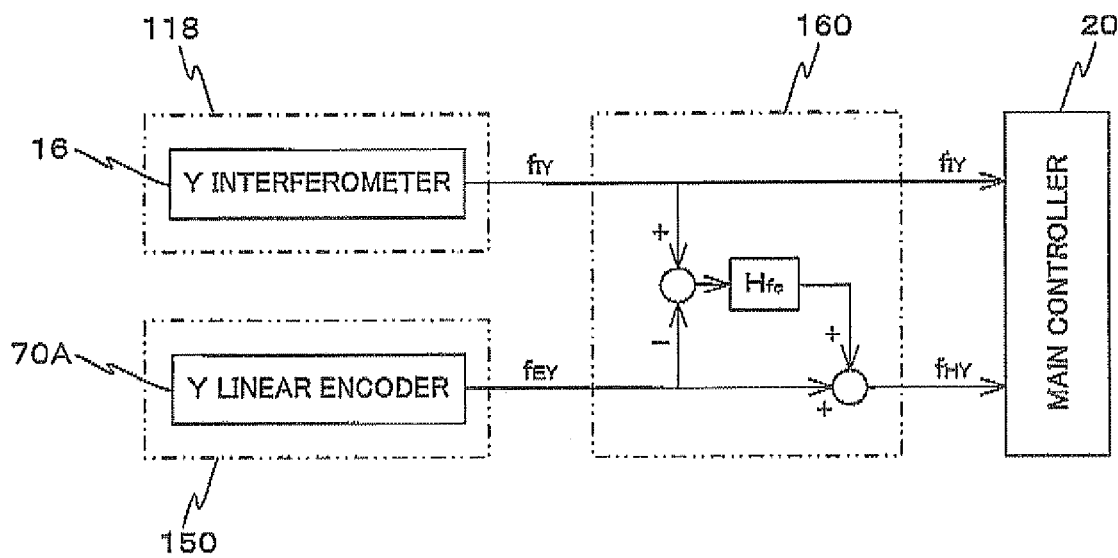

In other words, as shown in FIG. 9B, hybrid signal $F_{HY}(s)$ can also be synthesized by obtaining a difference $F_{IY}(s)-F_{EY}(s)$ which is the difference between output signal $F_{IY}(s)$ and output signal $F_{EY}(s)$, putting the difference through high pass filter $H_{fc}(s)$ of cutoff frequency fc, and then by further obtaining a sum of the difference and output signal $F_{EY}(s)$.

Signal processing device 160 transfers hybrid signal $F_{HY}(s)$ obtained in the manner described above to main controller 20 as a measurement result of Y linear encoder 70A. Further, signal processing device 160 also synthesizes output signals from other encoders 70B to 70F with output signals of the corresponding interferometers in a similar manner, and transfers the hybrid signals which have been obtained as measurement results of encoders 70B to 70F to main controller 20 (refer to FIG. 6).

The output signals of encoders 70A to 70F reflect a position (displacement) of wafer stage WST (to be more precise, the corresponding scale) in their respective measurement directions. Therefore, main controller 20 converts the output signals of encoders 70A to 70F into position (X, Y, θz) of wafer stage WST in the XX plane in such measurement directions. Main controller 20 drives (controls the position of) wafer stage WST1, based on the position (X, Y, θz) obtained above. Further, main controller 20d obtains the position of FD bar 46 from the output signals of encoders $70E_2$ and $70F_2$, and controls the rotation of FD bar 46 (wafer stage WST) in the θz direction according to the results.

In exposure apparatus 100 of the first embodiment, a series of processing operations like the ones described below is performed according to a procedure almost the same as in a normal scanning stepper. In other words, a) when wafer stage WST is at an unloading position shown in FIG. 4, wafer W is unloaded, and when wafer stage WST has moved to a loading position LP shown in FIG. 4, a new wafer W is loaded on wafer table WTB. In the vicinity of unloading position Up and loading position LP, the position of wafer stage WST in directions of six degree of freedom is controlled, based on the measurement values of interferometer system 118. At this point, X interferometer 128 is used.

In parallel with the wafer exchange described above being performed, a baseline measurement of the secondary alignment systems $AL2_1$ to $AL2_4$ is performed. This baseline measurement is performed using alignment systems AL1 and $AL2_1$ to $AL2_4$ and simultaneously measuring reference marks M on FD bar 46 within each of the fields in a state where the θz rotation of FD bar 46 is adjusted, based on the measurement values of encoders 70E2 and 70F2 previously described, as in the method disclosed in, U.S. Patent Application Publication No. 2008/0088843 described above.

b) After wafer exchange and the baseline measurement of secondary alignment systems $AL2_1$ to $AL2_4$ has been completed, wafer stage WST is moved and a former processing of a baseline check of primary alignment system AL1 where fiducial marks FM on measurement plate 30 are detected by primary alignment system AL1 is performed. Around the time of this processing, resetting (reset) of the origin of encoder system 150 and interferometer system 118 is performed.

c) Then, alignment measurement is performed in which alignment marks on a plurality of sample shot areas on wafer W are detected using alignment systems AL1, and $AL2_1$ to $AL2_4$, while measuring the position of wafer stage WST in directions of six degrees of freedom using encoder system 150 and interferometer system 118. When wafer stage WST moves in the +Y direction for alignment measurement, and measurement plate 30 reaches a position right under projection optical system PL, a latter processing of the baseline check of primary alignment system AL1, or in other words, reticle alignment is performed in which a positional relation between a center of a projection area of a pattern of reticle R and a reference position on the Measurement plate, or more specifically, a center of the pair of reference marks RM used for reticle alignment, is detected by projection optical system PL, by main controller 20 detecting a projected image of a pair of reticle alignment marks (omitted in drawings) formed on reticle R and the corresponding pair of reference marks RM used for reticle alignment on measurement plate 30 via projection optical system PL. Incidentally, the former processing and the latter processing (reticle alignment) of the base line check of primary alignment system AL1 can be reversed in order.

d) Then, when the alignment measurement is completed, the plurality of shot areas on wafer W is exposed by the step-and-scan method based on the positional information of each shot area on the wafer obtained as a result of the alignment measurement and the latest baseline of the alignment system, and a pattern of reticle R is transferred.

On exposure of the plurality of shot areas on wafer W by the step and scan method described above, drive (position control) of wafer stage WST is performed using the hybrid method previously described. On this drive, wafer stage WST performs a movement operation (a stepping operation) between shot areas along a U shaped path, as is disclosed in, for example, U.S. Patent Application Publication No. 2003/0128348 and the like. As a consequence, as for the Y-axis direction which is the scanning direction, wafer stage WST is driven according to a temporal change of speed as shown in FIG. 11A previously described, by hybrid signal $f_{HY}(t)$. Accordingly, at time Tc when wafer stage WST moves at a constant speed at maximum speed Vmax, scanning exposure is performed with reticle stage RST being driven in sync with wafer stage WST. And, at the time of this scanning exposure, the output signal of the interferometer (interferometer system 118) is used for the drive (position control) of wafer stage WST, whereas at the time of the stepping operation before and after the scanning exposure, the output signal of the encoder (encoder system 150) is used.

Here, details will be further described on the advantage of the drive (position control) of wafer stage WST by the hybrid method in the first embodiment.

In the diffraction interference type encoder used in exposure apparatus 100, since the optical path lengths of the two diffraction beams which are made to interfere are extremely short and are also almost equal to each other, the influence of air fluctuation can mostly be ignored when compared with an interferometer. Accordingly, by using encoder system 150 (encoders 70A to 70F), in principle, wafer stage WST can be driven (the position controlled) with high accuracy. Further, because the encoder uses a scale, the encoder is superior to the interferometer from the viewpoint of measurement reproducibility. However, because of production errors and mechanical, instabilities (drift of grating pitch, fixed position drift, thermal expansion and the like) of the scale, the encoder is inferior to the interferometer from the viewpoint of linearity.

Figure 13A:
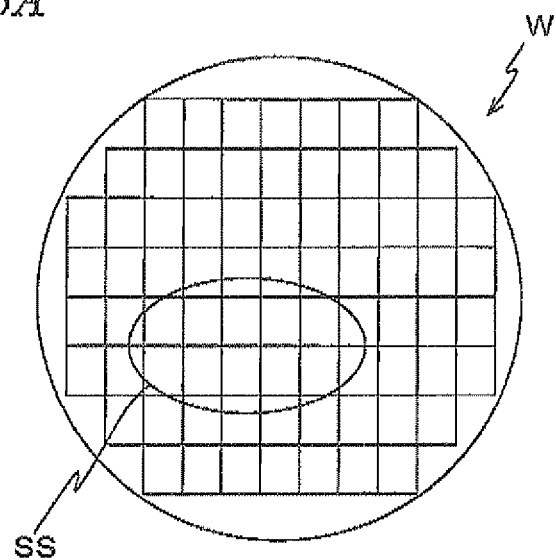
FIGS. 13A to 13C are views used to explain a shot distortion (pattern formation error) expected in a stage drive (position control) using an encoder system.
Figure 13B:
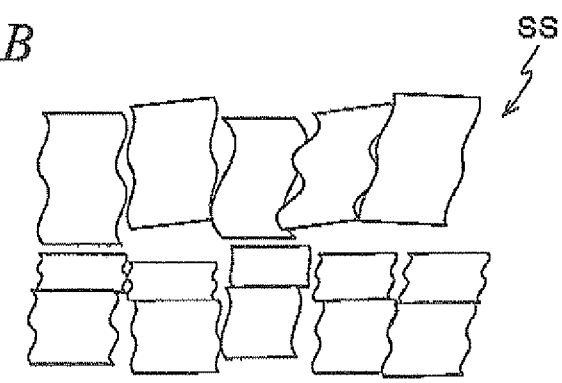

In the drive (position control) of wafer stage WST using encoder system 150, as for the true position (actual position) of wafer stage WST and (the measurement results of) the position of wafer stage WST measured by encoder system 150, the track of the actual position of wafer stage WST fluctuates minutely when the movement track of wafer stage WST corresponding to the measurement results of encoder system 150 serves as a reference, due to measurement errors which are caused by production errors and the like of the scale. Therefore, when wafer W shown in FIG. 13A is exposed by the step-and-scan method, it can be expected that the array of the shot areas arranged on the surface of wafer W will be altered (that is, a grid error occurs), and the shape of the shot areas will also be distorted (that is, a formation error of the pattern occurs), as shown in FIG. 13B which shows an enlarged view of a range surrounded by a reference code SS in FIG. 13A.

Further, in encoder system 150, the encoder heads facing the scales are switched and used, according to the position of wafer stage WST. When switching the encoder heads, a linkage process to secure the continuity of the measurement results of encoder system 150 is performed, as is disclosed in, for example, U.S. Patent Application Publication No. 2009/0027640 and the like. In this case, when an operation error (a linkage error) occurs in this linkage process, the measurement results are discontinuously altered, which in turn makes the actual position of wafer stage WST become discontinuously altered (the track is discontinuously uneven) Accordingly, when a linkage error occurs at the time of scanning exposure, it can be expected that a crack (more specifically, a crack of the pattern) will occur in the shot area as shown in FIG. 13B.

Further, by foreign materials such as dust, flaws and the like adhering on the scale surface and scanning such foreign materials, output signals from an encoder (a head) can be cut off momentarily, or an abnormal signal can be output. When such an inconvenience occurs at the time of scanning exposure, it can be expected that a crack of the pattern will Occur as in the case described above. Now, in the case of a liquid immersion exposure apparatus disclosed in, for example, PCT International Publication No. 99/49504 and the like, the liquid (liquid immersion liquid) supplied between a projection optical system and a wafer may remain on the scale, and because the remaining liquid immersion liquid serves as a foreign material, a crack of the pattern, discontinuously and the like can easily occur.

Accordingly, at the time of scanning exposure to each shot area, it is desirable to use a stable position measuring instrument (position measuring system) which is superior in linear measurement and whose temporal change of the output signals is moderate at the time of abnormality generation, or which does not cause an abnormal operation which is accompanied by a temporal change of the output signals. In this viewpoint, it is desirable to use an interferometer (interferometer system 118) at the time of scanning exposure as in the drive (position control) of wafer stage WST using the hybrid method in the first embodiment. This is because the time scale of air fluctuation which becomes a factor of measurement errors of the interferometer is relatively long compared to the time scale when performing scanning exposure on one shot area, and the fluctuation error (or to be precise, variation of the fluctuation error within the scanning exposure time) is not always large when it is limited to the time of performing scanning exposure on one shot area.

Figure 13C:
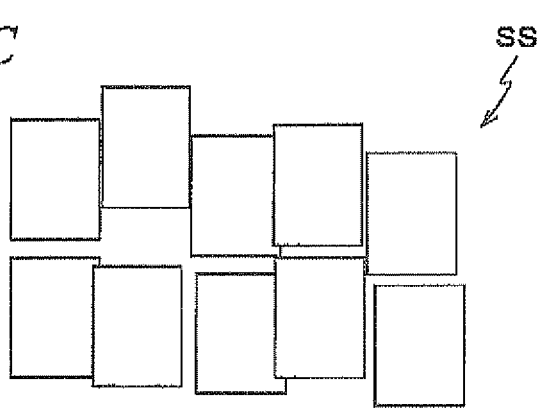

Accordingly, in the first embodiment, because the linear measurement of the position of wafer stage WST at the time of scanning exposure is secured, distortion of the shape of the shot area, or in other words, the formation error of the pattern is canceled as shown in FIG. 13C.

Meanwhile, at the time of stepping between the shot areas, it is desirable to use a position measuring instrument (position measuring system) which is not affected by the air fluctuation and is also superior in measurement reproducibility, in order to precisely align each shot area on the wafer to the exposure position according to the alignment results and to improve the overlay accuracy. In this viewpoint, it is desirable to use an encoder (encoder system 150) at the time of stepping, as in the drive (position control) of wafer stage WST using the hybrid method in the first embodiment. Distortion of the shot areas arranged caused by the measurement errors of encoder system 150, or in other words, grid errors, can easily be canceled by correcting the acceleration starting position with respect to each of the shot areas due to the high measurement reproducibility of encoder system 150.

However, especially in the exposure apparatus previously described using the liquid immersion exposure method, it is desirable to use a position measuring instrument (position measuring system) which is slow in temporal change of output signals at the time of abnormality generation, or a position measuring instrument whose temporal change of the output signals does not cause a notable abnormal operation so as to drive (control the position of) wafer stage WST in a stable manner. In this viewpoint, it is favorable to use the interferometer (interferometer system 118).

Incidentally, an offset for each of the X-axis direction, the Y-axis direction, and the θz direction of the acceleration start position are to be obtained in advance with respect to all of the shot areas. At the time of stepping, a target position to drive wafer stage WST to the next acceleration starting position, or in other words, the shot arrangement (the position of the individual shot areas) obtained by an alignment measurement is corrected, using the offset. This allows the acceleration starting position to be corrected, which in turn allows the remaining grid errors to be canceled easily. In addition, grid errors can be canceled, for example, as is disclosed in, for example, U.S. Patent Application Publication No. 2007/0260419 and the like, by driving a lens element configuring projection optical system PL, or by finely correcting the synchronous drive of reticle stage RST and wafer stage WST.

Incidentally, it is also possible to used positional information (hybrid positional information) of wafer stage WST obtained from a hybrid signal in the alignment measurement (for example, EGA measurement). In other words, in wafer stage control system 124, wafer stage WST is driven based on the first current position ($f_I$) measured by interferometer system 118, and alignment marks (sample marks) in a plurality of sample shot areas on wafer W are detected, using alignment systems AL1 and AL2$_1$ to AL2$_4$. On this detection, main controller 20 computes the position of each sample mark, based on measurement results (position ($\Delta x$, $\Delta y$) of each sample mark whose origin is the detection center of each alignment system) of each sample mark measured by alignment systems AL1 and AL2$_1$ to AL2$_4$, respectively, and hybrid positional information ($f_H$) which is the output of signal processing device 160. In this case, because the position detection of each sample mark is performed in a state (a positioning servo state based on the interferometer measurement values at the positioning target position) where wafer stage WST is positioned, the hybrid positional information ($f_H$) described above is the second current position ($f_E$), measured by encoder system 150. In other words, measurement errors of interferometer system 118 due to air fluctuation are not included in the detection results of the position of each sample mark. Further, at the detection position of each sample mark, main controller 20 can easily obtain an error between the first current position measured by interferometer system 118 and hybrid positional information, namely, the second current position measured by encoder system 150. And, on exposure of each of the plurality of shot areas by the step-and-scan method, main controller 20 moves wafer stage WST to a scanning starting position (an acceleration starting position) for exposure of each shot area based on the first current position ($f_I$) measured by interferometer system 118, and in doing so, the target position when moving wafer stage WST is corrected by the error amount described above. This allows each shot area on wafer W to be positioned accurately at a proper target position (a target position which does not include the effect of the measurement errors of interferometer system 118 due to air fluctuation) obtained from the measurement results of the sample marks, while carrying out a servo control of wafer stage WST by interferometer system 118.

Further, not only on alignment measurement but also on measurement and the like of optical properties of projection optical system PL, a measurement mark with respect to hybrid positional information is detected using a measuring instrument provided on wafer stage WST and the like and detection results are processed, while driving wafer stage WST using an output signal of interferometer system 118. This allows wafer stage WST to be driven in a stable manner on measurement, and also makes it possible to accurately align the pattern to each of the plurality of shot areas on exposure.

As described above, according to exposure apparatus 100 of the first embodiment, a hybrid signal is made by synthesizing the output signal of an interferometer (interferometer system 118) and the output signal of an encoder (encoder system 150) which are made to pass through a high pass filter and a low pass filter, respectively, and wafer stage WST is driven (position control performed) based on the hybrid signal that has been made. The cutoff frequency of a high pass filter and the low pass filter in this case, is set to a frequency corresponding to a speed slightly smaller than the speed of wafer stage WST at the time of the scanning exposure. This allows wafer stage WST to be driven based on the output signal of the interferometer (interferometer system 118) whose linear measurement is high at the time of scanning exposure (when the speed of wafer stage WST is higher than a threshold speed corresponding to the cutoff frequency), and also allows wafer stage WST to be driven based on the output signal of the encoder (encoder system 150) whose measurement reproducibility is high at the time of stepping (when the speed of wafer stage WST is lower than the threshold speed). Accordingly, it becomes possible to linearly drive wafer stage WST at a constant speed quickly and with high precision, as well as drive wafer stage WST precisely to the starting position of the constant speed drive, which in turn allows a pattern to be formed by accurately overlaying the pattern in each of a plurality of shot areas arranged on a wafer.

Further, because wafer stage WST is driven and controlled using the output signal of the interferometer (interferometer system 118) at the time of scanning exposure, measurement errors caused by switching a head in encoder system 150, scanning a foreign material adhered on the scale and the like, especially variation of a discontinuous measurement result will not occur. Accordingly, an accurate pattern transfer without any distortion, crack and the like becomes possible.

Further, because wafer stage WST is driven based on the output signal of the encoder (encoder system 150) at the time of stepping between shots, the pattern can be aligned to the shot areas with good reproducibility, as is described above. In this case, while distortion of the shot areas arranged occurring due to the measurement errors of encoder system 150, or in other words, grid errors may remain, the errors can easily be canceled by correcting the results of the alignment measurement due to the high measurement reproducibility of encoder system 150.

Further, in exposure apparatus 100 of the first embodiment, main controller 20 performs alignment measurement using alignment systems AL1 and $AL2_1$ to $AL2_4$, while driving wafer stage WST based on the output (measurement results) of the interferometer (interferometer system 118). In this case, alignment marks are detected with respect to positional information (hybrid positional information) of wafer stage WST obtained by the hybrid signal described above, and are processed. Based on such detection results, the accurate target position of the plurality of shot areas on wafer W are computed, and wafer stage WST is aligned with respect to a true target position while a servo control of wafer stage WST is performed based on the measurement results of interferometer system 118, and the plurality of shot areas on wafer W are exposed by the step-and-scan method. Accordingly, wafer stage WST can be driven in a stable manner on alignment measurement. Further, it becomes possible to accurately align a pattern to each of the plurality of shot areas when a pattern is transferred.

Second Embodiment

Next, a second embodiment will be described. Here, the same reference numerals will be used for the same or similar sections as in the first embodiment previously described, and a detailed description thereabout will be simplified or omitted.

In the exposure apparatus of the second embodiment, the configuration and the like of the apparatus is the same as exposure apparatus 100 of the first embodiment previously described, except for a part of a stage control system which will be described later on The description below will be focusing on a synchronous drive control of wafer stage WST and reticle stage RST employed in the exposure apparatus of the second embodiment which uses a hybrid method by encoder system 150 and interferometer system 118.

In the synchronous drive control by the hybrid method in the exposure apparatus of the second embodiment, signal processing device 160 synthesizes (makes) a hybrid signal from an output signal of the interferometer (interferometer system 118) and an output signal of the encoder (encoder system 150) using a high-pass filter and a low-pass filter of a cut-off frequency fc, and the synchronous drive of wafer stage WST and reticle stage RST is controlled based on the hybrid signal.

As in the first embodiment previously described, output signals from encoders 70A to 70F are synthesized with the output signals of the corresponding interferometers by signal processing device 160, and hybrid signals $F_{HY}(s)$ which have been obtained are sent to main controller 20 as measurement results of encoders 70A to 70F (refer to FIG. 6).

The output signals of encoders 70A to 70F reflect a position (displacement) of wafer stage WST (to be more precise, the corresponding scale) in their respective measurement directions. Therefore, main controller 20 converts the output signals of encoders 70A to 70F into position (X, Y, θz) of wafer stage WST in the XY plane in such measurement directions. Main controller 20 controls the synchronous drive of wafer stage WST and reticle stage RST, using information (referred to as hybrid positional information) on the position of wafer stage WST (X, Y, and θz) obtained from the hybrid signals as is described above.

Figure 14:
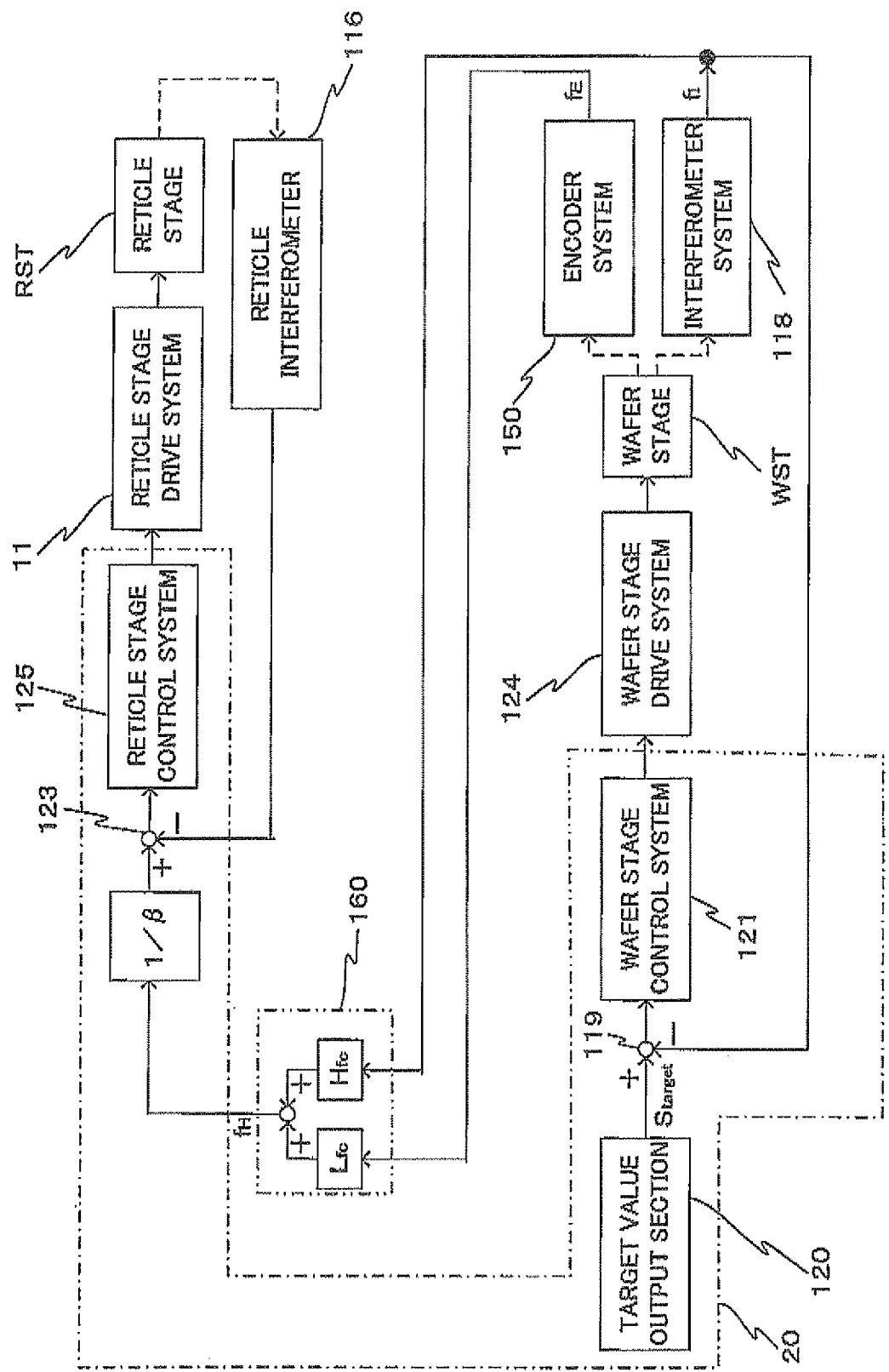
FIG. 14 is a block diagram showing an example of an arrangement of a stage control system, which performs a drive (position control) of a wafer stage and a reticle stage including control and the like of the synchronous drive of the wafer stage and the reticle stage using hybrid positional information.

FIG. 14 is a block diagram showing an arrangement of a stage control system, which performs a drive (position control) of wafer stage WST and reticle stage RST including control and the like of the synchronous drive of wafer stage WST and reticle stage RST using the hybrid positional information.

The stage control system is equipped with a target value output section 120 which outputs a target position $S_{target}$ of wafer stage WST, a first position error computing section 119 which computes an error (a deviation signal) between target position $S_{target}$ and a first current position of wafer stage WST measured by interferometer system 118, a wafer stage control system 121 which controls the movement of wafer stage WST using the error (deviation signal) computed by the first position error computing section 119 as an operation signal, a signal processing device 160 to which the first current position of wafer stage WST measured by interferometer system 118 and a second current position of wafer stage WST measured by encoder system 150 are input, a second position error computing section 123 which computes an error (a deviation signal) between a target position of reticle stage RST that is 1/β times the hybrid position signal (hybrid positional information) output from signal processing device 160 and a current position of reticle stage RST measured by reticle interferometer 116, and a reticle stage control system 125 which controls the movement of the reticle stage using the error (deviation signal) computed by the second position error computing section 123 as an operation signal.

Of each of the components described above, target value output section 120, the first position error computing section 119, wafer stage control system 121, 1/β gain of the hybrid position signal, the second position error computing section 123, and reticle stage control system 125 are each a part of a function of main controller 20 which are described as a function block. Incidentally, while signal processing device 160 is provided separately from main controller 20, as well as this, the function of signal processing device 160 can also naturally be a part of a function of main controller 20.

To first position error computing section 119, target position $S_{target}$ of wafer stage WST is input from target value output section 120, as well as the first current position of wafer stage WST measured by interferometer system 118, and a position error (a deviation signal) with respect to the target position is computed and is sent to wafer stage control system 121. Wafer stage control system 121 performs a control operation (a P or a PI operation) using the deviation signal as an operation signal, and provides a control quantity to wafer stage drive system 124. Wafer stage drive system 124 drives wafer stage WST by generating a thrust corresponding to the control quantity which has been provided. This allows wafer stage WST to move, and the position of wafer stage WST is measured by interferometer system 118, and the measurement values are fed back to the first position error computing section 119 previously described.

In the stage control system related to the second embodiment, relative alignment of both stages WST and RST is performed by making the reticle stage RST side follow wafer stage WST during scanning exposure of the step and scan method in the case wafer stage WST is shifted from the target position of wafer stage WST.

More specifically, in the case the reticle stage RST side is made to follow wafer stage WST, the first current position ($f_{IY}$ and the like previously described, referred to as $f_I$ in general) of wafer stage WST measured by interferometer system 118 and the second current position ($f_{EY}$ and the like previously described, referred to as $f_E$ in general) of wafer stage WST measured by encoder system 150 are input into signal processing device 160. And, the hybrid position signal (hybrid positional information, namely $f_{HY}$ and the like, which is referred to in general as $f_H$) previously described is synthesized by signal processing device 160, multiplied by 1/β times, and then is provided to the second position error computing section 123 as a target position of reticle stage RST. The second position error computing section 123 computes a position error (a deviation signal) between the given target position of reticle stage RST and the current position of reticle stage RST measured using reticle interferometer 116, and provides the position error to reticle stage control system 125. Reticle stage control system 125 performs a control operation (a P or a PI operation) using the given deviation signal as an operation signal, and drives (controls the position of) reticle stage RST via reticle stage drive system 11 so that the deviation signal converges to zero.

In the control (including the control of a synchronous drive by the hybrid method) of wafer stage WST and reticle stage RST by the stage control system, because the drive (position control) of wafer stage WST is performed based on measurement values of interferometer system 118, it is preferable in terms of stability. In addition, even if an error occurs in the drive (position control) of wafer stage WST by interferometer system 118, because a highly precise hybrid positional information is input into reticle stage control system 125 as a position target value, and reticle stage RST is driven following wafer stage WST, it becomes possible to perform a relative position control (including synchronous drive) of both stages WST and RST with enough control accuracy.

In the exposure apparatus of the second embodiment as well, as in exposure apparatus 100 of the first embodiment previously described, a series of processing operations previously described is performed according to a procedure almost the same as in a normal scanning stepper. And, in the exposure apparatus of the second embodiment, the synchronous drive (follow-up drive) of wafer stage WST and reticle stage RST by the hybrid method previously described is performed, on exposure of the plurality of shot areas on wafer W by the step-and-scan method previously described. On this drive, wafer stage WST performs a movement operation (a stepping operation) between shot areas along a U shaped path, as is disclosed in, for example, U.S. Patent Application Publication No. 2003/0128348 and the like. As a consequence, as for the Y-axis direction which is the scanning direction, wafer stage WST is driven based on the current position measured by interferometer system 118, and reticle stage RST is driven concurrently in accordance with the temporal change of speed of wafer stage WST (and reticle stage RST) shown in FIG. 11A previously described, by hybrid signal $f_{HY}(t)$. Accordingly, at time Tc when wafer stage WST moves at a constant speed at maximum speed Vmax, scanning exposure is performed with reticle stage RST being driven in sync with wafer stage WST. And, at the time of this scanning exposure, the output signal of the interferometer (interferometer system 118) is used when reticle stage RST follows (controls the position of) wafer stage WST, whereas at the time of the stepping operation before and after the scanning exposure, the output signal of the encoder (encoder system 150) is used.

The synchronous drive (follow-up drive) control of wafer stage WST by the hybrid method in the second embodiment has the following the advantage, in addition to the advantage of the drive (position control) of wafer stage WST by the hybrid method in the first embodiment. In other words, by employing the control of the synchronous drive of both stages WST and RST using the hybrid method described above, the follow-up drive of reticle stage RST with respect to wafer stage WST is controlled, based on measurement results of interferometer system 118 at the time of scanning exposure and (mainly of) encoder system 150 at the time of stepping (at the time of acceleration and deceleration before and after exposure), while driving (controlling the position of) wafer stage WST using interferometer system 118. Accordingly, because the linear measurement of the position of wafer stage WST at the time of scanning exposure is secured, distortion of the shape of the shot area, or in other words, the formation error of the pattern is canceled as shown in FIG. 13C. Furthermore, distortion of the shot areas arranged caused by the measurement errors of encoder system 150, or in other words, grid errors, can easily be canceled by correcting the acceleration starting position with respect to each of the shot areas due to the high measurement reproducibility of encoder system 150.

According to the exposure apparatus of the second embodiment described so far, a hybrid signal is made by synthesizing the output signal of an interferometer (interferometer system 118) and the output signal of an encoder (encoder system 150) which are made to pass through a high pass filter and a low pass filter, respectively, and reticle stage RST is made to perform a follow-up drive (position control) with respect to wafer stage WST based on the hybrid signal that has been made. The cutoff frequency of a high pass filter and the low pass filter in this case, is set to a frequency corresponding to a speed slightly smaller than the speed of wafer stage WST at the time of the scanning exposure. This allows reticle stage RST to perform a follow-up drive (position control) to wafer stage WST based on the output signal of the interferometer (interferometer system 118) whose linear measurement is high at the time of scanning exposure (when the speed of wafer stage WST is higher than a threshold speed corresponding to the cutoff frequency), and also allows reticle stage RST to perform a follow-up drive (position control) to wafer stage WST based on the output signal of the encoder (encoder system 150) whose measurement reproducibility is high at the time of stepping (when the speed of wafer stage WST is lower than the threshold speed). Accordingly, it becomes possible to form a pattern by accurately overlaying the pattern in each of a plurality of shot areas arranged on a wafer.

Further, because reticle stage RST is made to perform a follow-up drive (position control) to wafer stage WST using the output signal of the interferometer (interferometer system 118) at the time of scanning exposure, measurement errors caused by switching a head in encoder system 150, scanning a foreign material adhered on the scale and the like, especially variation of a discontinuous measurement result will not occur. Accordingly, an accurate pattern transfer without any distortion, crack and the like becomes possible.

Further, because reticle stage RST is made to perform a follow-up drive (position control) to wafer stage WST based on the output signal of the encoder (encoder system 150) at the time of stepping drive, the pattern can be overlaid on (aligned to) the shot areas with good reproducibility, as is described above. In this case, while distortion of the shot areas arranged occurring due to the measurement errors of encoder system 150, or in other words, grid errors may remain, the errors can easily be canceled by correcting the results of the alignment measurement due to the high measurement reproducibility of encoder system 150.

The exposure apparatus of each embodiment described above also has an effect described below, in addition to the effect described above. In other words, because the hybrid signal is made by synthesizing the output signal of the interferometer (interferometer system 118) and the output signal of the encoder (encoder system 150) that have passed through a high pass filter and a low pass filter, one of the output signal of the interferometer (interferometer system 118) and the output signal of the encoder (encoder system 150) is output as the hybrid signal by the function of the filter according to the speed of wafer stage WST, which is used to drive (perform position control of) wafer stage WST. Accordingly, the switching process between the interferometer (interferometer system 118) and the encoder (encoder system 150), and the linkage process which is performed to secure the continuity of the positional information of wafer stage WST before and after the switching will not be required, and errors (linkage errors) that accompany the linkage computing will not occur.

Incidentally, in each embodiment described above, the cutoff frequency of the high pass filter and the low pass filter was set constant. In this case, the way that measurement errors of the encoder (encoder system 150) caused by a scale production error appear may change according to the speed of wafer stage WST. Therefore, the cutoff frequency can be set to fluctuate slightly, depending on the speed of wafer stage WST. While such setting of the cutoff frequency to fluctuate is performed, for example, by an operator, the increase and decrease of the cutoff frequency corresponding to the speed of wafer stage WST in accordance with the setting can be performed by main controller 20. Changing (setting) the cutoff frequency is no other than to perform a weighting of a drive period in which wafer stage WST and/or reticle stage RST is driven based on the output signals of the interferometer (interferometer system 118) and a drive period in which wafer stage WST and/or reticle stage RST is driven based on the output signals of the encoder (encoder system 150), and on setting the cutoff frequency, main controller 20 functions as a setting device which performs such weighting. Further, the high pass filter and the low pass filter can be selected appropriately, depending on the behavior of the measurement errors of the encoder (encoder system 150).

Incidentally, it is a matter of course that the configuration of each measurement device such as the encoder system described in each embodiment above is a mere example. For example, in each embodiment above, an example has been described where an encoder system is employed that has a configuration where a grid section (a Y scale and an X scale) is arranged on a wafer table (a wafer stage), and an X head and a Y head facing the grid section is placed external to the wafer stage, however, the present invention is not limited to this, and as is disclosed in, for example, the U.S. Patent Application Publication No. 2006/0227309 description, an encoder system which is configured having an encoder head arranged on the wafer stage and has a grid section (for example, a two-dimensional grid, or a linear grid section having a two-dimensional placement) facing the encoder heads placed external to the wafer stage can also be adopted. In this case, a Z head (a head of a surface position sensor which measures a Z position of the wafer and the wafer table) can also be provided on the wafer stage, and the surface of the grid section can be a reflection surface on which the measurement beam of the Z head is irradiated.

Further, in each embodiment above, while the case has been described, for example, where only an encoder head was arranged inside head units 62A and 62C, an encoder head and a Z head can be provided separately inside each head unit, or a single head that has the function of both an encoder head and a Z head can be provided. As a single head which has the function of an encoder head and a Z head, a sensor head whose measurement direction is in one of the X-axis direction and the Y-axis direction, and the Z-axis direction can be used. As such a sensor head, a displacement measurement sensor head whose details are disclosed in, for example, U.S. Pat. No. 7,561,280, can be used.

Incidentally, in each embodiment described above, while the case has been described where the exposure apparatus was a dry type exposure apparatus that performs exposure of wafer W without liquid (water), as well as this, as is disclosed in, for example, EP Patent Application Publication No. 1,420, 298, PCT International Publication No. 2004/055803, each of the embodiments described above can also be applied to an exposure apparatus which has a liquid immersion space including an optical path of the illumination light between a projection optical system and a wafer, and exposes the wafer with the illumination light via the projection optical system and the liquid in the liquid immersion space. Further, each embodiment described above can be applied to a liquid immersion exposure apparatus and the like whose details are disclosed in, for example, U.S. Patent Application Publication No. 2008/008843. In the liquid immersion exposure apparatus disclosed in U.S. Patent Application Publication No. 2008/0088843, an encoder system is employed in which a measurement beam is irradiated on a grating (scale) provided on a wafer stage, and by receiving its reflected light, a relative position between a head and a scale in a periodic direction of the grating is measured.

Further, in each embodiment described above, while a case has been described where the exposure apparatus was a scanning exposure apparatus by a step-and-scan method, as well as this, each of the embodiments above can also be applied to a reduction projection exposure apparatus by a step-and-stitch method that synthesizes a shot area and a shot area, an exposure apparatus by a proximity method, a mirror projection aligner and the like. Further, each embodiment described above can also be applied to a multi-stage type exposure apparatus equipped with a plurality of wafer stages, as is disclosed in, for example, U.S. Pat. No. 6,590,634, U.S. Pat. No. 5,969,441, U.S. Pat. No. 6,208,407 and the like.

Further, the magnification of the projection optical system in the exposure apparatus in each embodiment above is not only a reduction system, but also may be either an equal magnifying or a magnifying system, and projection optical system PL is not only a dioptric system, but also may be either a catoptric system or a catadioptric system, and in addition, the projected image may be either an inverted image or an upright image. Further, the illumination area and exposure area described above are to have a rectangular shape. However, the shape is not limited to rectangular, and can also be circular arc, trapezoidal, parallelogram or the like.

Incidentally, the light Source of the exposure apparatus in each embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm), an i-line (wavelength: 365 nm) and the like can also be used. Further, a harmonic wave generating unit of a YAG laser or the like can also be used. Besides the sources above, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a non-linear optical crystal, can also be used.

Further, in each embodiment above, illumination light IL of the exposure apparatus is not limited to the light having a wavelength more than or equal to 100 nm, and it is needless to say that the light having a wavelength less than 100 nm can be used. For example, each embodiment above can be suitably applied to an EUV exposure apparatus whose exposure light is an EUV (Extreme Ultraviolet) light in a soft X-ray range (e.g. a wavelength range from 5 to 15 nm) that uses a total reflection reduction optical system and a reflective mask. In addition, each embodiment above can also be applied to an exposure apparatus that uses charged particle beams such as an electron beam or an ion beam.

Further, in the embodiment above, a light transmissive type mask (reticle) is used, which is obtained by forming a predetermined light-shielding pattern (or a phase pattern or a light-attenuation pattern) on a light-transmitting substrate, but instead of this reticle, as disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display element (spatial light modulator) or the like) on which a light-transmitting pattern, a reflection pattern, or an emission pattern is formed according to electronic data of the pattern that is to be exposed can also be used.

Further, for example, each embodiment described above can also be applied to an exposure apparatus (lithography system) that forms line-and-space patterns on a wafer by forming interference fringes on the wafer.

Moreover, each embodiment described above can also be applied to an exposure apparatus that synthesizes two reticle patterns on a wafer via a projection optical system and substantially simultaneously performs double exposure of one shot area on the wafer by one scanning exposure, as disclosed in, for example, U.S. Pat. No. 6,611,316.

Further, an apparatus that forms a pattern on an object is not limited to the exposure apparatus (lithography system) described above, and for example, each embodiment described above can also be applied to an apparatus that forms a pattern on an object by an ink-jet method.

Incidentally, an object on which a pattern is to be formed an object subject to exposure to which an energy beam is irradiated) in each embodiment described above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micro-machines, DNA chips, and the like. Further, each embodiment described above can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a reticle is transferred onto the wafer by the exposure apparatus (pattern formation apparatus) in the embodiment previously described, a development step where the wafer that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus in each embodiment described above, a highly integrated device can be produced with good productivity.

Incidentally, the disclosures of all publications, the Published PCT International Publications, the U.S. Patent Applications and the U.S. patents that are cited in the description so far related to exposure apparatuses and the like are each incorporated herein by reference.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body drive method in which a movable body is driven along a predetermined plane, the method comprising:
  driving the movable body based on one of
    a synthesized signal of a first signal which is a first detection signal that has been made to pass through a high pass filter and a second signal which is a second detection signal that has been made to pass through a low pass filter having a cut off frequency which is the same as the high pass filter, the first detection signal corresponding to a position of the movable body obtained by receiving a return beam of a measurement beam via an optical member provided on the movable body, and the second detection signal being obtained by irradiating a measurement beam on a diffraction grating on a measurement plane parallel to the predetermined plane provided on one of the movable body and an outside of the movable body and receiving a diffraction beam from the diffraction grating by a measurement system which has at least a part of the system placed on the other of the movable body and the outside of the movable body, and a signal which is substantially equivalent to the synthesized signal.

2. The movable body drive method according to claim 1 wherein positional information of the movable body is obtained based on one of the synthesized signal and the signal which is substantially equivalent to the synthesized signal, and the movable body is driven based on the positional information.

3. The movable body drive method according to claim 1 wherein each of the first and the second detection signals includes at least one component that corresponds to a direction parallel to a first axis and at least one component that corresponds to a direction parallel to a second axis, the first axis and the second axis being orthogonal to each other within the predetermined plane, and a component of the first detection signal and a component of the second detection signal corresponding to the direction parallel to the first axis are synthesized as the synthesized signal, and a component of the first detection signal and a component of the second detection signal corresponding to the direction parallel to the second axis are synthesized as the synthesized signal.

4. The movable body drive method according to claim 1 wherein the second detection signal includes a plurality of components which are obtained by irradiating the measurement beam on each of a plurality of irradiation points on the measurement plane, and each of the plurality of components of the second detection signals are synthesized with a corresponding component of the first detection signal.

5. The movable body drive method according to claim 1 wherein the cutoff frequency increases and decreases depending on the speed of the movable body.

6. An exposure method, comprising:

making a movable body hold an object subject to exposure; and driving the movable body by using the movable body drive method according to claim 1 when irradiating an energy beam on the object held by the movable body and forming a pattern on the object.

7. A device manufacturing method, including:

forming a pattern on an object by the exposure method according to claim 6; and developing the object on which the pattern is formed.

8. A movable body apparatus, comprising:

a movable body which moves along a predetermined plane;

a first measurement system which outputs a first detection signal corresponding to a position of the movable body obtained by receiving a return beam of a measurement beam via an optical member provided on the movable body;

a second measurement system which outputs a second detection signal by irradiating a measurement beam on a diffraction grating on a measurement plane parallel to the predetermined plane provided on one of the movable body and an outside of the movable body and receiving a diffraction beam from the diffraction grating, and has at least a part of the system placed on the other of the movable body and the outside of the movable body; and a drive system which drives the movable body based on a synthesized signal of a first signal which is the first detection signal that has passed through a high pass filter and a second signal which is the second detection signal that has passed through a low pass filter having the same cutoff frequency as the high pass filter, or a signal which is substantially equivalent to the synthesized signal.

9. The movable body apparatus according to claim 8 wherein the drive system obtains positional information of the movable body based on one of the synthesized signal and the signal which is substantially equivalent to the synthesized signal, and drives the movable body based on the positional information.

10. The movable body apparatus according to claim 9 wherein the first measurement system outputs at least one component of the first detection signal that corresponds to a direction parallel to each of a first axis and a second axis and the second measurement system outputs at least one component of the second detection signal that corresponds to a direction parallel to each of the first axis and the second axis, the first axis and the second axis being orthogonal to each other within the predetermined plane, and the drive system synthesizes a component of the first detection signal and a component of the second detection signal corresponding to the direction parallel to the first axis as the synthesized signal, and synthesizes a component of the first detection signal and a component of the second detection signal corresponding to the direction parallel to the second axis as the synthesized signal.

11. The movable body apparatus according to claim 8 wherein the second measurement system has a plurality of head sections each irradiating the measurement beam on each of a plurality of irradiation points on the measurement plane, and the drive system synthesizes each of a plurality of components of the second detection signals with a corresponding component of the first detection signal, the plurality of components being obtained by the plurality of head sections irradiating the measurement beam on the plurality of irradiation points, respectively, on the measurement plane.

12. The movable body apparatus according to claim 8 wherein the cutoff frequency increases and decreases depending on the speed of the movable body.

13. The movable body apparatus according to claim 8 wherein the first measurement system is an interferometer system.

14. The movable body apparatus according to claim 8 wherein the second measurement system is an encoder system.

15. An exposure apparatus, comprising:

the movable body apparatus according to claim 8 in which an object is held by the movable body; and a pattern generation device which generates a pattern by irradiating an energy beam on the object held by the movable body and exposing the object.

16. An exposure method in which an energy beam is irradiated on a mask on which a pattern is formed, and the pattern is transferred on an object, the method comprising:
driving at least one of a first movable body which moves along a predetermined plane holding the object and a second movable body which holds the mask, based on one of
a synthesized signal of a first signal which is a first detection signal that has been made to pass through a high pass filter and a second signal which is a second detection signal that has been made to pass through a low pass filter having a cut off frequency which is the same as the high pass filter, the first detection signal corresponding to a position of the first movable body obtained by receiving a return beam of a measurement beam via an optical member provided on the first movable body, and the second detection signal being obtained by irradiating a measurement beam on a diffraction grating on a measurement plane parallel to the predetermined plane provided on one of the first movable body and an outside of the first movable body and receiving a diffraction beam from the diffraction grating by a measurement system which has at least a part of the system placed on the other of the first movable body and the outside of the first movable body, and
a signal which is substantially equivalent to the synthesized signal.

17. The exposure method according to claim 16 wherein in the driving, the first movable body is driven.

18. The exposure method according to claim 17 wherein positional information of the first movable body is obtained based on one of the synthesized signal and the signal which is substantially equivalent to the synthesized signal, and the first movable body is driven based on the positional information.

19. The exposure method according to claim 16 wherein in the driving, follow up drive of the second movable body holding the mask is performed with respect to the first movable body.

20. The exposure method according to claim 19 further comprising:
driving the first movable body based on the first signal.

21. The exposure method according to claim 20 wherein positional information of the first movable body is obtained based on one of the synthesized signal and the signal which is substantially equivalent to the synthesized signal, and the second movable body is driven based on the positional information, and
positional information of the first movable body is obtained using the first signal, and the first movable body is driven based on the positional information.

22. The exposure method according to claim 16 wherein each of the first and the second signals includes at least one component that corresponds to a direction parallel to a first axis and at least one component that corresponds to a direction parallel to a second axis, the first axis and the second axis being orthogonal to each other within the predetermined plane, and
a component of the first signal and a component of the second signal corresponding to the direction parallel to the first axis are synthesized, and a component of the first signal and a component of the second signal corresponding to the direction parallel to the second axis are synthesized.

23. The exposure method according to claim 16 wherein the second signal includes a plurality of components which are obtained by irradiating the measurement beam on each of a plurality of irradiation points on the measurement plane, and
each of the plurality of components of the second signals is synthesized with a corresponding component of the first signal.

24. The exposure method according to claim 16 wherein the cutoff frequency increases and decreases depending on the speed of the first movable body.

25. A device manufacturing method, including:
forming a pattern on an object by the exposure method according to claim 16; and
developing the object on which the pattern is formed.

26. An exposure method in which a mask and an object are synchronously moved in a predetermined direction while an energy beam is irradiated on the mask on which a pattern is formed, and the pattern is transferred onto the object, the method comprising:
driving at least one movable body of a first movable body moving along a predetermined plane holding the object and a second movable body holding the mask, according to a predetermined temporal change curve of speed and also along a predetermined path based on a drive signal, while switching between a first detection signal corresponding to a position of the first movable body output by an interferometer system which detects positional information of the first movable body and a second detection signal corresponding to a position of the first movable body output by an encoder system which detects positional information of the first movable body that serve as the drive signal, by making the first detection signal and the second detection signal pass through a high pass filter and a low pass filter that have the same cutoff frequency, respectively; and
performing a weighting of a first drive period in which the at least one movable body is driven based on the first detection signal and a second drive period in which the at least one movable body is driven based on the second detection signal by setting the cutoff frequency.

27. The exposure method according to claim 26 wherein the switching of the drive signal is performed by generating, as the drive signal, one of a synthesized signal of a first signal which is the first detection signal that has been made to pass through the high pass filter and a second signal which is the second detection signal that has been made to pass through the low pass filter, and a signal substantially equivalent to the synthesized signal.

28. The exposure method according to claim 27 wherein each of the first and the second signals includes at least one component that corresponds to a direction parallel to a first axis and at least one component that corresponds to a direction parallel to a second axis, the first axis and the second axis being orthogonal to each other within the predetermined plane, and
a component of the first signal and a component of the second signal corresponding to the direction parallel to the first axis are synthesized, and a component of the first signal and a component of the second signal corresponding to the direction parallel to the second axis are synthesized.

29. The exposure method according to claim 27 wherein in the driving, the first movable body is driven.

30. The exposure method according to claim 29 wherein the encoder system has at least a part of the system placed outside of the first movable body, and irradiates a measurement beam on a diffraction grating on a measurement plane parallel to the predetermined plane provided on the first movable body, receives a diffraction beam from the diffraction grating, and outputs the second detection signal.

31. A device manufacturing method, including:
forming a pattern on an object by the exposure method according to claim 26; and
developing the object on which the pattern is formed.

32. An exposure apparatus which irradiates an energy beam on a mask on which a pattern is formed, and transfers the pattern on an object, the apparatus comprising:
a first movable body which holds the object and moves along a predetermined plane;
a second movable body which moves holding the mask;
a first measurement system which outputs a first detection signal corresponding to a position of the first movable body obtained by receiving a return beam of a measurement beam via an optical member provided on the first movable body;
a second measurement system which outputs a second detection signal by irradiating a measurement beam on a diffraction grating on a measurement plane parallel to the predetermined plane provided on one of the first movable body and an outside of the first movable body and receiving a diffraction beam from the diffraction grating, and has at least a part of the system placed on the other of the first movable body and the outside of the first movable body; and
a movable body drive system which drives at least one of the first movable body and the second movable body, based on one of a synthesized signal and a signal which is substantially equivalent to the synthesized signal, the synthesized signal being obtained by synthesizing a first signal which is the first detection signal that has passed through a high pass filter and a second signal which is the second detection signal that has passed through a low pass filter having the same cutoff frequency as the high pass filter.

33. The exposure apparatus according to claim 32 wherein the movable body drive system drives the first movable body.

34. The exposure apparatus according to claim 33 wherein the movable body drive system obtains positional information of the first movable body based on one of the synthesized signal and the signal which is substantially equivalent to the synthesized signal, and drives the first movable body based on the positional information.

35. The exposure apparatus according to claim 32 wherein the movable body drive system performs a follow up drive of the second movable body with respect to the first movable body.

36. The exposure apparatus according to claim 35 wherein the movable body drive system drives the first movable body based on the first signal.

37. The exposure apparatus according to claim 36 wherein the movable body drive system
obtains positional information of the first movable body based on one of the synthesized signal and the signal which is substantially equivalent to the synthesized signal, and drives the second movable body based on the positional information, and
obtains positional information of the first movable body using the first signal, and drives the first movable body based on the positional information.

38. The exposure apparatus according to claim 32 wherein each of the first and the second signals includes at least one component that corresponds to a direction parallel to a first axis and at least one component that corresponds to a direction parallel to a second axis, the first axis and the second axis being orthogonal to each other within the predetermined plane, and
in the movable body drive system, one of a synthesized signal and a signal which is substantially equivalent to the synthesized signal is used, in the synthesized signal a component of the first signal and a component of the second signal corresponding to the direction parallel to the first axis being synthesized and a component of the first signal and a component of the second signal corresponding to the direction parallel to the second axis being synthesized.

39. The exposure apparatus according to claim 32 wherein the second measurement system has a plurality of head sections each irradiating the measurement beam on each of a plurality of irradiation points on the measurement plane, and
in the movable body drive system, one of a synthesized signal and a signal which is substantially equivalent to the synthesized signal is used, the synthesized signal being obtained by synthesizing each of the second signals obtained by putting the second detection signals from the plurality of head sections through the low pass filter and the first signal obtained by putting the corresponding first detection signal through the high pass filter.

40. The exposure apparatus according to claim 32 wherein the cutoff frequency increases and decreases depending on the speed of the movable body.

41. The exposure apparatus according to claim 32 wherein the first measurement system is an interferometer system.

42. The exposure apparatus according to claim 32 wherein the second measurement system is an encoder system.

43. A device manufacturing method, including:
forming a pattern on an object using the exposure apparatus according to claim 32; and
developing the object on which the pattern is formed.

44. An exposure apparatus that synchronously moves a mask and an object in a predetermined direction while irradiating an energy beam on the mask on which a pattern is formed, and transfers the pattern onto the object, the apparatus comprising:
a first movable body which holds the object and moves along a predetermined plane;
a second movable body which moves holding the mask;
an interferometer system which detects positional information of the first movable body, and outputs a first detection signal corresponding to a position of the first movable body;
an encoder system which detects positional information of the first movable body, and outputs a second detection signal corresponding to the position of the first movable body;
a drive system which drives at least one movable body of the first movable body and the second movable body, according to a predetermined temporal change curve of speed and also along a predetermined path based on a drive signal, while switching between the first detection signal and the second detection signal that serve as the drive signal, by making the first detection signal and the second detection signal pass through a high pass filter and a low pass filter that have the same cutoff frequency, respectively; and a setting device which performs a weighting of a first drive period in which the at least one movable body is driven based on the first detection signal and a second drive period in which the at least one movable body is driven based on the second detection signal by setting the cutoff frequency.

45. The exposure apparatus according to claim 44 wherein the drive system performs the switching of the drive signal by generating one of a synthesized signal and a signal substantially equivalent to the synthesized signal as the drive signal, the synthesized signal being of a first signal which is the first detection signal that has been made to pass through the high pass filter and a second signal which is the second detection signal that has been made to pass through the low pass filter.

46. The exposure apparatus according to claim 45 wherein each of the first and the second signals includes at least one component that corresponds to a direction parallel to a first axis and at least one component that corresponds to a direction parallel to a second axis, the first axis and the second axis being orthogonal to each other within the predetermined plane, and in the drive system, one of a synthesized signal and a signal which is substantially equivalent to the synthesized signal is used as the drive signal, in the synthesized signal the components of the first and the second signals corresponding to the direction parallel to the first axis being synthesized and the components of the first and the second signals corresponding to the direction parallel to the second axis being synthesized.

47. The exposure apparatus according to claim 45 wherein the drive system drives the first movable body based on the drive signal.

48. The exposure apparatus according to claim 47 wherein the encoder system has at least a part of the system placed outside of the first movable body, and irradiates a measurement beam on a diffraction grating on a measurement plane parallel to the predetermined plane provided on the first movable body, receives a diffraction beam from the diffraction grating, and outputs the second detection signal.

49. The exposure apparatus according to claim 44 wherein the setting device increases and decreases the cutoff frequency, depending on the speed of the movable body.

50. A device manufacturing method, including
forming a pattern on an object using the exposure apparatus according to claim 44; and
developing the object on which the pattern is formed.

51. An exposure method in which an energy beam is irradiated on a mask on which a pattern is formed, and the pattern is transferred on an object, the method comprising:

driving at least one of a first movable body which moves along a predetermined plane holding the object and a second movable body which holds the mask, based on one of a synthesized signal and a signal which is substantially equivalent to the synthesized signal, the synthesized signal being of a first signal which is a first detection signal that has been made to pass through a first frequency filter that cuts off a signal lower than a predetermined frequency and a second signal which is a second detection signal that has been made to pass through a second frequency filter that cuts off a frequency higher than the predetermined frequency, the first detection signal corresponding to a position of the movable body obtained by receiving a return beam of a measurement beam via an optical member provided on the first movable body, and the second detection signal being obtained by irradiating a measurement beam on a diffraction grating on a measurement plane parallel to the predetermined plane provided on one of the movable body and an outside of the movable body and receiving a diffraction beam from the diffraction grating by a measurement system which has at least a part of the system placed on the other of the movable body and the outside of the movable body.

52. The exposure method according to claim 51 wherein positional information of the first movable body is obtained based on one of the synthesized signal and the signal which is substantially equivalent to the synthesized signal, and the first movable body is driven based on the positional information.

53. The exposure method according to claim 51 wherein positional information of the first movable body is obtained, based on one of the synthesized signal and the signal which is substantially equivalent to the synthesized signal, and a follow up drive of the second movable body is performed with respect to the first body, based on the positional information.

54. The exposure method according to claim 53 wherein positional information of the first movable body is obtained using the first signal, and the first movable body is driven based on the positional information.

55. The exposure method according to claim 51 wherein each of the first and the second signals includes at least one component that corresponds to a direction parallel to a first axis and at least one component that corresponds to a direction parallel to a second axis, the first axis and the second axis being orthogonal to each other within the predetermined plane, and a component of the first signal and a component of the second signal corresponding to the direction parallel to the first axis are synthesized and a component of the first signal and a component of the second signal corresponding to the direction parallel to the second axis are synthesized.

56. A device manufacturing method, including:
forming a pattern on an object by the exposure method according to claim 51; and
developing the object on which the pattern is formed.

57. An exposure apparatus which irradiates an energy beam on a mask on which a pattern is formed, and transfers the pattern on an object, the apparatus comprising:

a first movable body which holds the object and moves along a predetermined plane;

a second movable body which moves holding the mask;

a first measurement system which outputs a first detection signal corresponding to a position of the first movable body obtained by receiving a return beam of a measurement beam via an optical member provided on the first movable body;

a second measurement system which outputs a second detection signal by irradiating a measurement beam on a diffraction grating on a measurement plane parallel to the predetermined plane provided on one of the first movable body and an outside of the first movable body and receiving a diffraction beam from the diffraction grating, and has at least a part of the system placed on the other of the first movable body and the outside of the first movable body; and a movable body drive system which drives at least one of the first movable body and the second movable body, based on one of a synthesized signal and a signal which is substantially equivalent to the synthesized signal, the synthesized signal being obtained by synthesizing a first signal which is the first detection signal that has been made to pass through a first frequency filter that cuts off a signal lower than a predetermined frequency and a second signal which is the second detection signal that has been made to pass through a second frequency filter that cuts off a frequency higher than the predetermined frequency.

58. The exposure apparatus according to claim 57 wherein the movable body drive system obtains positional information of the first movable body based on one of the synthesized signal and the signal which is substantially equivalent to the synthesized signal, and drives the first movable body based on the positional information.

59. The exposure apparatus according to claim 57 wherein the movable body drive system obtains positional information of the first movable body based on one of the synthesized signal and the signal which is substantially equivalent to the synthesized signal, and performs a follow up drive of the second movable body with respect to the first body, based on the positional information.

60. The exposure apparatus according to claim 59 wherein positional information of the first movable body is obtained using the first signal, and the first movable body is driven based on the positional information.

61. The exposure apparatus according to claim 57 wherein the second measurement system has a plurality of head sections each irradiating the measurement beam on each of a plurality of irradiation points on the measurement plane, and in the movable body drive system, one of a synthesized signal and a signal which is substantially equivalent to the synthesized signal is used, the synthesized signal being obtained by synthesizing each of the second signals obtained by putting the second detection signals from the plurality of head sections through the second frequency filter and the first signal obtained by putting the corresponding first detection signal through the first frequency filter.

62. The exposure apparatus according to claim 57 wherein the first measurement system is an interferometer system.

63. The exposure apparatus according to claim 57 wherein the second measurement system is an encoder system.

64. A device manufacturing method, including:

forming a pattern on an object using the exposure apparatus according to claim 57; and developing the object on which the pattern is formed.

* * * * *